United States Patent
Wu et al.

(10) Patent No.: US 11,775,098 B2
(45) Date of Patent: Oct. 3, 2023

(54) FLEXIBLE ELECTRONIC DEVICE

(71) Applicant: InnoLux Corporation, Miao-Li County (TW)

(72) Inventors: Yuan-Lin Wu, Miao-Li County (TW); Yu-Chia Huang, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/964,070

(22) Filed: Oct. 12, 2022

(65) Prior Publication Data
US 2023/0147678 A1 May 11, 2023

(30) Foreign Application Priority Data
Nov. 11, 2021 (CN) .......................... 202111334487.3

(51) Int. Cl.
| | |
|---|---|
| *G06F 3/041* | (2006.01) |
| *H05K 1/18* | (2006.01) |
| *G06F 3/01* | (2006.01) |
| *G06F 3/044* | (2006.01) |
| *G06F 3/042* | (2006.01) |

(52) U.S. Cl.
CPC ............ *G06F 3/0412* (2013.01); *G06F 3/016* (2013.01); *H05K 1/189* (2013.01); *G06F 3/042* (2013.01); *G06F 3/0414* (2013.01); *G06F 3/0446* (2019.05); *G06F 2203/04102* (2013.01); *G06F 2203/04111* (2013.01); *H05K 2201/10128* (2013.01); *H05K 2201/10151* (2013.01)

(58) Field of Classification Search
CPC ......... G06F 1/1652; G06F 2203/04102; G06F 3/016; G06F 3/0412; G06F 3/0414; G06F 3/042; G06F 3/0446; G06F 2203/04111; H05K 1/189; H05K 2201/10128; H05K 2201/10151; G09F 9/301
See application file for complete search history.

(56) References Cited

U.S. PATENT DOCUMENTS

| | | | |
|---|---|---|---|
| 2009/0174673 A1* | 7/2009 | Ciesla | G06F 3/016 345/173 |
| 2014/0098075 A1* | 4/2014 | Kwak | G09G 3/2003 345/204 |
| 2016/0198567 A1* | 7/2016 | Hong | G06F 3/0412 362/418 |
| 2020/0210003 A1* | 7/2020 | Hong | G06F 3/016 |

OTHER PUBLICATIONS

Gary Barrett et al., Projected-Capacitive Touch Technology, frontline technology, Information Display, Mar. 2010, p. 16-21, XP055919015, Mar. 2010.

* cited by examiner

*Primary Examiner* — Temesghen Ghebretinsae
*Assistant Examiner* — Ivelisse Martinez Quiles
(74) *Attorney, Agent, or Firm* — Winston Hsu

(57) ABSTRACT

A flexible electronic device is disclosed. The flexible electronic device includes a protruding unit, a flexible substrate and a plurality of sensing units. The flexible substrate is disposed on the protruding unit and has a deformation region corresponding to the protruding unit. The sensing units are disposed on the flexible substrate, and at least one of the sensing units is overlapped with the deformation region. A ratio of an area of the deformation region to an area of one of the at least one of the sensing units is greater than or equal to 1.4 and less than or equal to 2222.

13 Claims, 22 Drawing Sheets

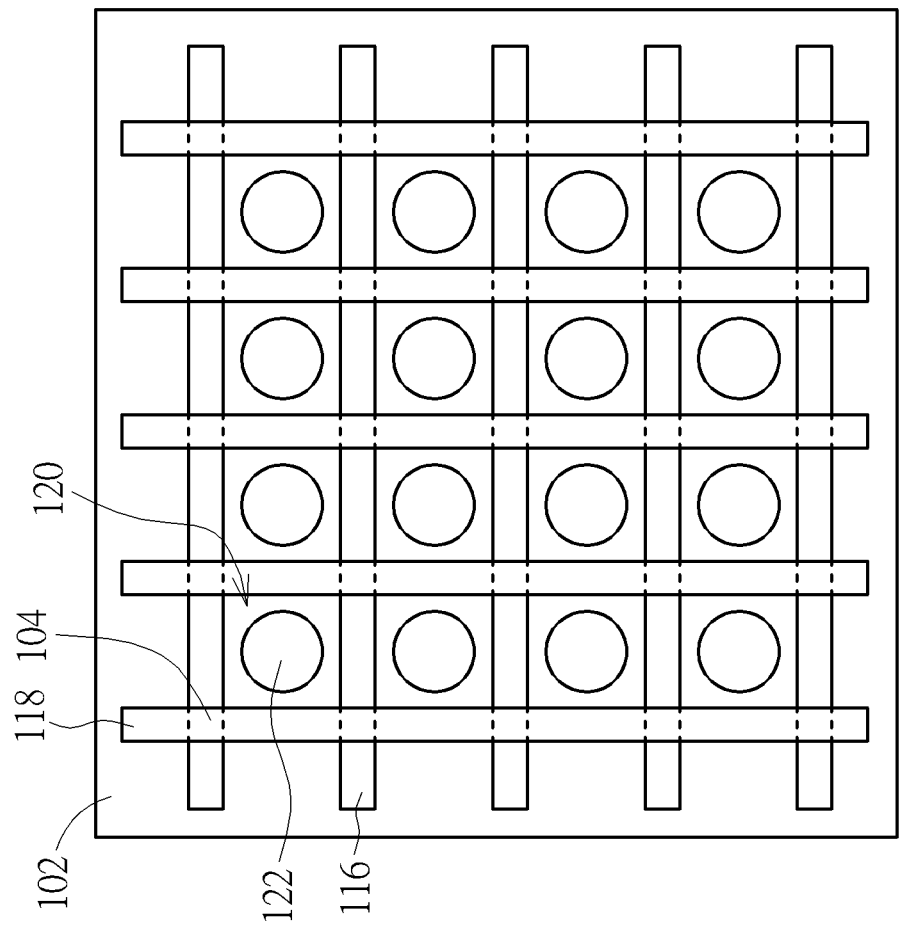
FIG. 4
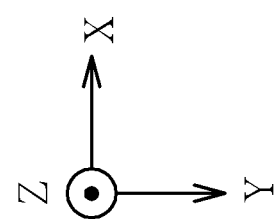

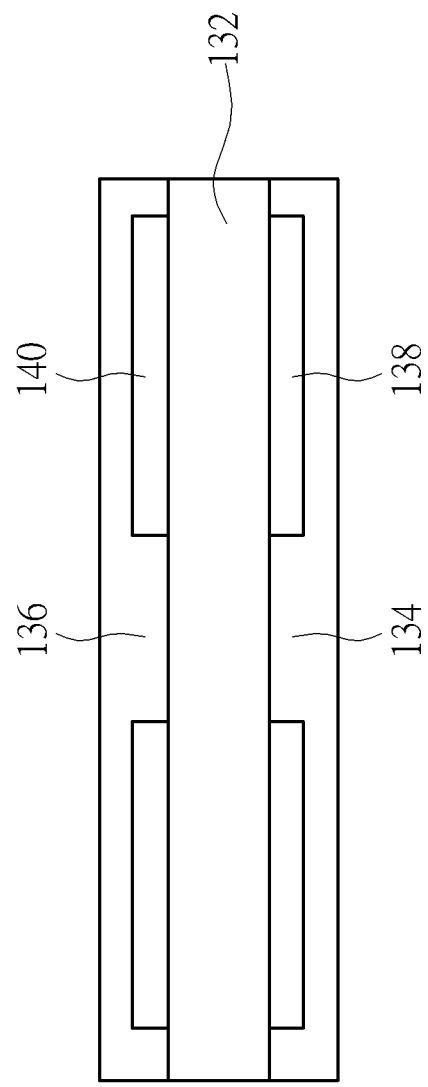
FIG. 6
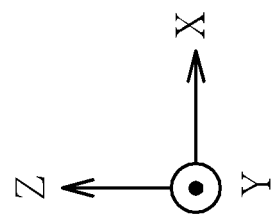

FLEXIBLE ELECTRONIC DEVICE

BACKGROUND OF THE DISCLOSURE

1. Field of the Disclosure

The present disclosure relates to a flexible electronic device, and more particularly to a flexible electronic device including a protruding unit.

2. Description of the Prior Art

In recent years, flexible electronic devices are widely applied in various electronic products, such as smart phones, tablets, notebook computers, televisions, vehicle displays or wearable devices. With the wide application of electronic products, manufacturers keep on researching and developing for new flexible electronic devices, and have higher expectations for the user experience and reliability of products.

SUMMARY OF THE DISCLOSURE

Some embodiments of the present disclosure provide a flexible electronic device, through the design of the appropriate proportion for the area of the deformation region of the flexible substrate and the area of the sensing unit disposed on the flexible substrate, the sensing units may not be easily damaged by the deformation of the flexible substrate when the flexible substrate is deformed by the protruding unit and also provide a good sensing effect.

Some embodiments of the present disclosure provide a flexible electronic device including a protruding unit, a flexible substrate and a plurality of sensing units. The flexible substrate is disposed on the protruding unit and has a deformation region corresponding to the protruding unit. The sensing units are disposed on the flexible substrate, and at least one of the sensing units is overlapped with the deformation region. A ratio of an area of the deformation region to an area of one of the at least one of the sensing units is greater than or equal to 1.4 and less than or equal to 2222.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 3 to FIG. 6 are schematic diagrams of sensing units according to some embodiments of the present disclosure.

DETAILED DESCRIPTION

Figure 1:
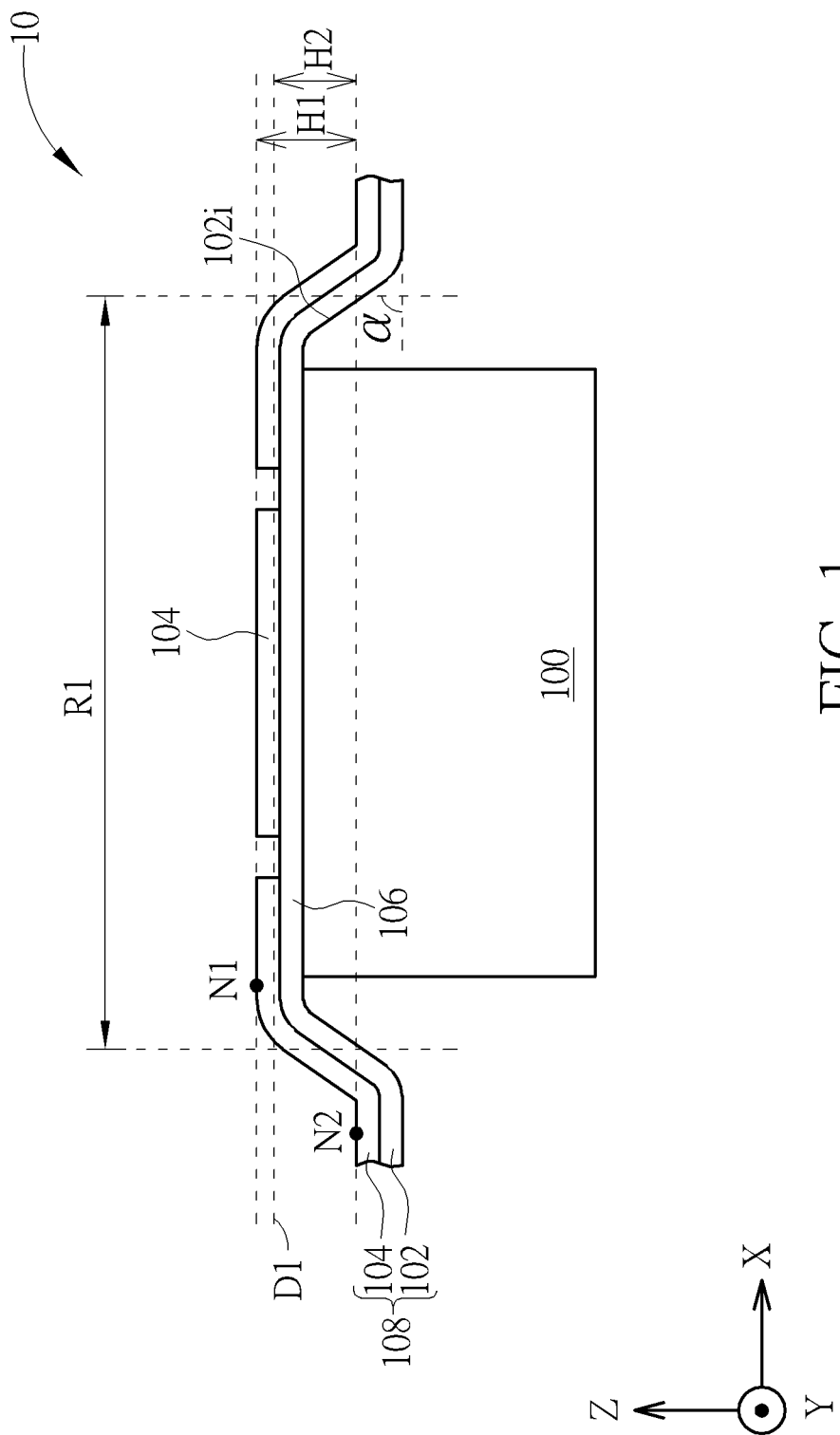
FIG. 1 is a cross-sectional view schematic diagram of a flexible electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

The directional terms mentioned in this document, such as "up", "down", "front", "back", "left", "right", etc., are only directions referring to the drawings. Therefore, the directional terms used are for illustration, not for limitation of the present disclosure. In the drawings, each drawing shows the general characteristics of methods, structures and/or materials used in specific embodiments. However, these drawings should not be interpreted as defining or limiting the scope or nature covered by these embodiments. For example, the relative size, thickness and position of each layer, region and/or structure may be reduced or enlarged for clarity.

It should be understood that when an element or layer is referred to as being "on", "disposed on" or "connected to" another element or layer, it may be directly on or directly connected to the other element or layer, or intervening elements or layers may be presented (indirect condition). In contrast, when an element is referred to as being "directly on", "directly disposed on" or "directly connected to" another element or layer, there are no intervening elements or layers presented. In addition, the arrangement relationship between different elements may be interpreted according to the contents of the drawings.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

The electronic device of the present disclosure may include a display device, a backlight device, an antenna device, a sensing device or a tiled device, but not limited herein. The electronic device may include a bendable, flexible or rollable electronic device. The display device may include a non-self-emissive display device or a self-emissive display device, but not limited herein. The antenna device may include a liquid crystal antenna device or an antenna device without liquid crystal, and the sensing device may include a sensing device used for sensing capacitance, light, heat, pressure, electromagnetic waves or ultrasonic waves, but not limited herein.

Electronic elements or electronic units may include passive elements and active elements, such as capacitors, resistors, inductors, diodes, transistors, light-emitting elements, etc. The diodes may include light-emitting diodes or a photodiodes, but not limited herein. The light-emitting elements may be light-emitting diodes. The light-emitting diodes may include, for example, organic light-emitting diodes (OLEDs), inorganic light-emitting diodes or a combination thereof. The inorganic light-emitting diodes may be mini light-emitting diodes (mini LEDs), micro light-emitting diodes (micro LEDs), or quantum dot light-emitting diodes (quantum dot LEDs), but not limited herein. The tiled device may be, for example, a display tiled device or an antenna tiled device, but not limited herein. It should be noted that the electronic device may be any arrangement and combination of the above, but not limited herein.

A direction X (a first direction), a direction Y (a second direction) and a direction Z (a third direction) are labeled in the following drawings. The direction Z may be a normal direction or a top-view direction, the direction X and the direction Y may be horizontal directions and perpendicular to the direction Z, and the direction X may be perpendicular to the direction Y, but not limited herein. The following drawings may describe the spatial relationship of structures according the direction X, the direction Y and the direction Z.

Figure 2:
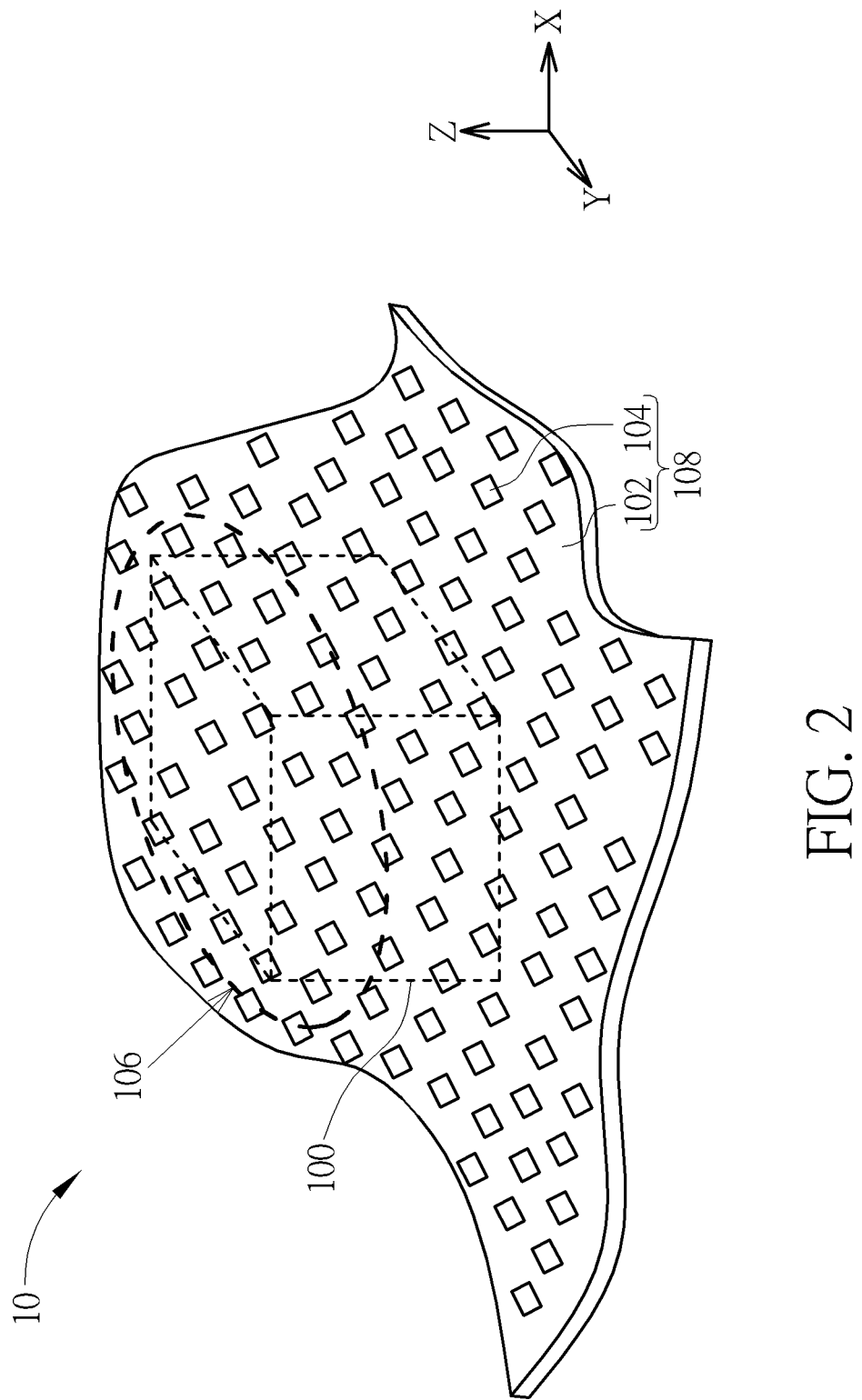
FIG. 2 is a three-dimensional schematic diagram of the flexible electronic device according to the first embodiment of the present disclosure.

Please refer to FIG. 1 and FIG. 2. FIG. 1 is a cross-sectional view schematic diagram of a flexible electronic device according to a first embodiment of the present disclosure. FIG. 2 is a three-dimensional schematic diagram of the flexible electronic device according to the first embodiment of the present disclosure. The flexible electronic device 10 may include a protruding unit 100, a flexible substrate 102 and a plurality of sensing units 104, but not limited herein. The flexible substrate 102 may be disposed on the protruding unit 100 and have a deformation region 106, and the deformation region 106 may correspond to the protruding unit 100. For example, the deformation region 106 is capable of being stuck out by the protruding unit 100, but not limited herein. In some embodiments, the cross-sectional shape of the protruding unit 100 may be rectangular, but not limited herein. The protruding unit 100 may have different shapes according to different designs. As shown in FIG. 1 and FIG. 2, the sensing units 104 may be disposed on the flexible substrate 102, and at least one of the sensing units 104 may be overlapped with the deformation region 106 in the direction Z.

In some embodiments, a ratio of an area of the deformation region 106 to an area of one of the sensing units 104 may be within a suitable range, for example, greater than or equal to 1.4 and less than or equal to 2222, but not limited herein. Thus, through the design of the appropriate proportion for the area of the deformation region 106 of the flexible substrate 102 and the area of the sensing unit 104 disposed on the flexible substrate 102, the sensing units 104 may not be easily damaged by the deformation of the flexible substrate 102 when the flexible substrate 102 is deformed by the protruding unit 100 and also provide a good sensing effect, thereby improving the user experience and reliability of the flexible electronic device 10. For example, the sensing unit 104 may correctly sense the touch when the user's finger touches the deformation region 106.

As shown in FIG. 2, in some embodiments, the area of the deformation region 106 may be greater than or equal to 26 square millimeters and less than half of the area of the flexible substrate 102, so that the user experience and reliability of the flexible electronic device 10 may be improved. In some embodiments, the area of the deformation region 106 may be less than 26 square millimeters, and the stress generated by the deformation may be too large, which may cause the wires or other electronic elements on the flexible substrate 102 to be easily damaged. In some embodiments, the area of the deformation region 106 may be greater than half of the area of the flexible substrate 102, and the effect of deformation may be poor, which may make the user's finger feel the deformation region 106 less easily. However, in the present disclosure, the design of size described above may still be adopted according to practical requirements.

A method of defining the area of the deformation region 106 described above may be interpreted through FIG. 1. In FIG. 1, the flexible electronic device 10 may include a panel 108, and the panel 108 may include a flexible substrate 102 and a sensing unit 104, but the present disclosure is not limited herein. A height H1 exists between the highest point N1 of an upper surface of the panel 108 and the lowest point N2 of the upper surface of the panel 108 in the direction Z when the deformation region 106 is stuck out by the protruding unit 100. The upper surface of the panel 108 in FIG. 1 is indicated by an upper surface of the sensing unit 104, but the present disclosure is not limited herein.

Then, a height H2 may be calculated. The height H2 is 0.9 times the height H1 (i.e. H2=0.9H1), and the height H2 may be measured upward from the lowest point N2 of the upper surface of the panel 108 in the direction Z. In FIG. 1, the position of the height H2 is indicated by a line D1. The line D1 may be a virtual straight line parallel to the direction X, and a range R1 may be defined by the intersections of the line D1 and the upper surface of the panel 108. An area of the projection of the flexible substrate 102 within the range R1 on a plane parallel to the direction X (e.g., a XY-plane, which is a plane defined by the direction X (the first direction) and the direction Y (the second direction)) may be defined as the area of the deformation region 106 of the flexible substrate 102. The deformation region 106 is also shown in FIG. 2. In addition, the definition of the area of the deformation region 106 described above may be applied to other embodiments of the present disclosure.

In addition, in some embodiments, the height H1 may be greater than or equal to 0.5 millimeters (mm) and less than or equal to 50 mm (i.e., 0.5 mm<H1<50 mm), so that the user experience and reliability of the flexible electronic device 10 may be improved. In some embodiments, the height H1 may be greater than 50 mm, and the stress generated by the deformation may be too large, which may cause the wires or other electronic elements on the flexible substrate 102 to be easily damaged. In some embodiments, the height H1 may be less than 0.5 mm, and the effect of deformation may be poor, which may make the user's finger feel the deformation region 106 less easily. However, in the present disclosure, the design of size described above may still be made according to practical requirements.

In some embodiments, a portion of one of the sensing units 104 may be overlapped with the deformation region 106, but not limited herein. In some embodiments, one of the sensing units 104 may be completely overlapped with the deformation region 106, but not limited herein. In some embodiments, the sensing units 104 are capable of sensing a touch, but not limited herein. In some embodiments, the sensing units 104 may sense biometric characteristics such as fingerprints, but not limited herein.

In some embodiments, the area of the deformation region 106 may be greater than or equal to 26.01 square millimeters and less than or equal to 10000 square millimeters. Additionally, among at least one of the sensing units 104 overlapped with the deformation region 106, the area of one of the sensing units 104 may be greater than or equal to 4.5 square millimeters and less than or equal to 18 square millimeters.

In some embodiments, the sensing units 104 may include capacitance sensors, pressure sensors, electromagnetic sensors, optical sensors or a combination of the capacitance sensors, the pressure sensors, the electromagnetic sensors and the optical sensors. In some embodiments, the plurality of sensing units 104 in the flexible electronic device 10 may be a plurality of sensors of the same type described above, such as a plurality of capacitance sensors. In some embodiments, the plurality of sensing units 104 in the flexible electronic device 10 may be a plurality of sensors of different types described above, such as a plurality of capacitance sensors and a plurality of optical sensors.

Figure 3:
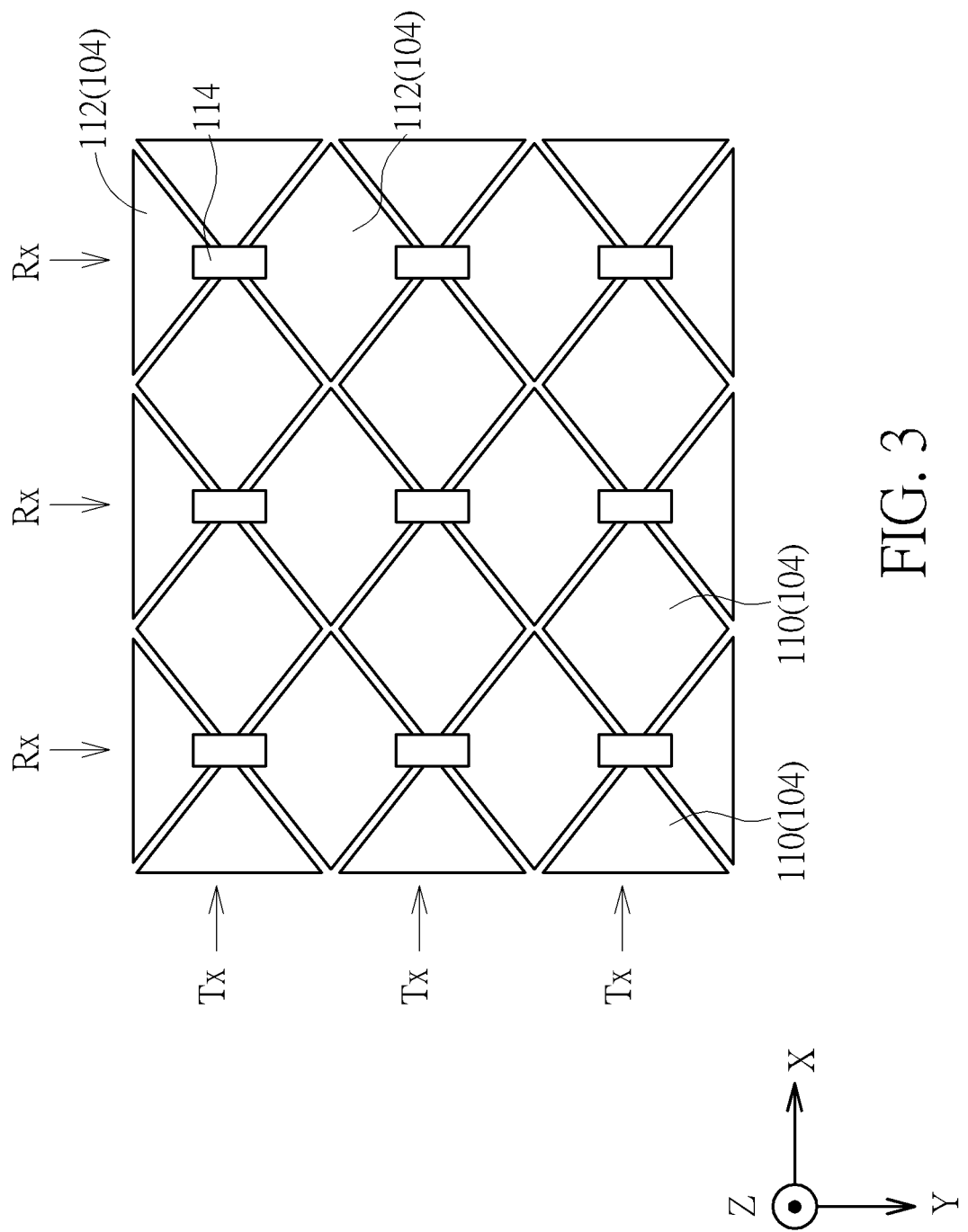

In some embodiments, the sensing unit 104 may be the smallest unit capable of conducting sensing. Please refer to FIG. 3 to FIG. 6, which are schematic diagrams of sensing units according to some embodiments of the present disclosure. As shown in FIG. 3 and FIG. 4, the sensing units 104 may include capacitance sensors, but not limited herein. In some embodiments, the capacitance sensors may be used as touch sensors and include self-sensing or mutual-sensing touch sensors, but not limited herein. As shown in FIG. 3, in some embodiments, a plurality of sensing electrode series Tx and a plurality of sensing electrode series Rx may constitute a plurality of capacitance sensors, but not limited herein. One of the sensing electrode series Tx may include a plurality of sensing electrodes 110 arranged along the direction X and electrically connected to each other. One of the sensing electrode series Rx may include a plurality of sensing electrodes 112 and a plurality of bridging electrodes 114, the sensing electrodes 112 may be arranged along the direction Y, and two adjacent sensing electrodes 112 may be electrically connected to each other through one bridging electrode 114. The sensing electrodes 110 and the sensing electrodes 112 may include transparent conductive materials, but not limited herein. As shown in FIG. 3, one of the sensing electrodes 110 or one of the sensing electrodes 112 may be used as one sensing unit (capacitance sensor) 104, so an area of one sensing unit 104 may be an area of one sensing electrode 110 or an area of one sensing electrode 112, but not limited herein.

As shown in FIG. 4, in some embodiments, a plurality of sensing electrodes 116 and a plurality of sensing electrodes 118 are disposed on the flexible substrate 102 and electrically insulated from each other to constitute a plurality of capacitance sensors, but not limited herein. The sensing electrodes 116 may extend in the direction X, and the sensing electrodes 118 may extend along the direction. The sensing electrodes 116 may intersect the sensing electrodes 118, and a portion that the sensing electrode 116 is overlapped with the sensing electrode 118 may be used as one sensing unit (capacitance sensor) 104, so an area of one sensing unit 104 may be an area of the portion that the sensing electrode 116 is overlapped with the sensing electrode 118, but not limited herein. In addition, the sensing electrodes 116 may intersect the sensing electrodes 118 to form a plurality of openings 120, and the flexible electronic device 10 may include a plurality of light-emitting elements 122 disposed in the openings 120, but not limited herein. The type of the light-emitting elements 122 may be referred to the previous paragraphs, and will not be described redundantly.

Figure 5:
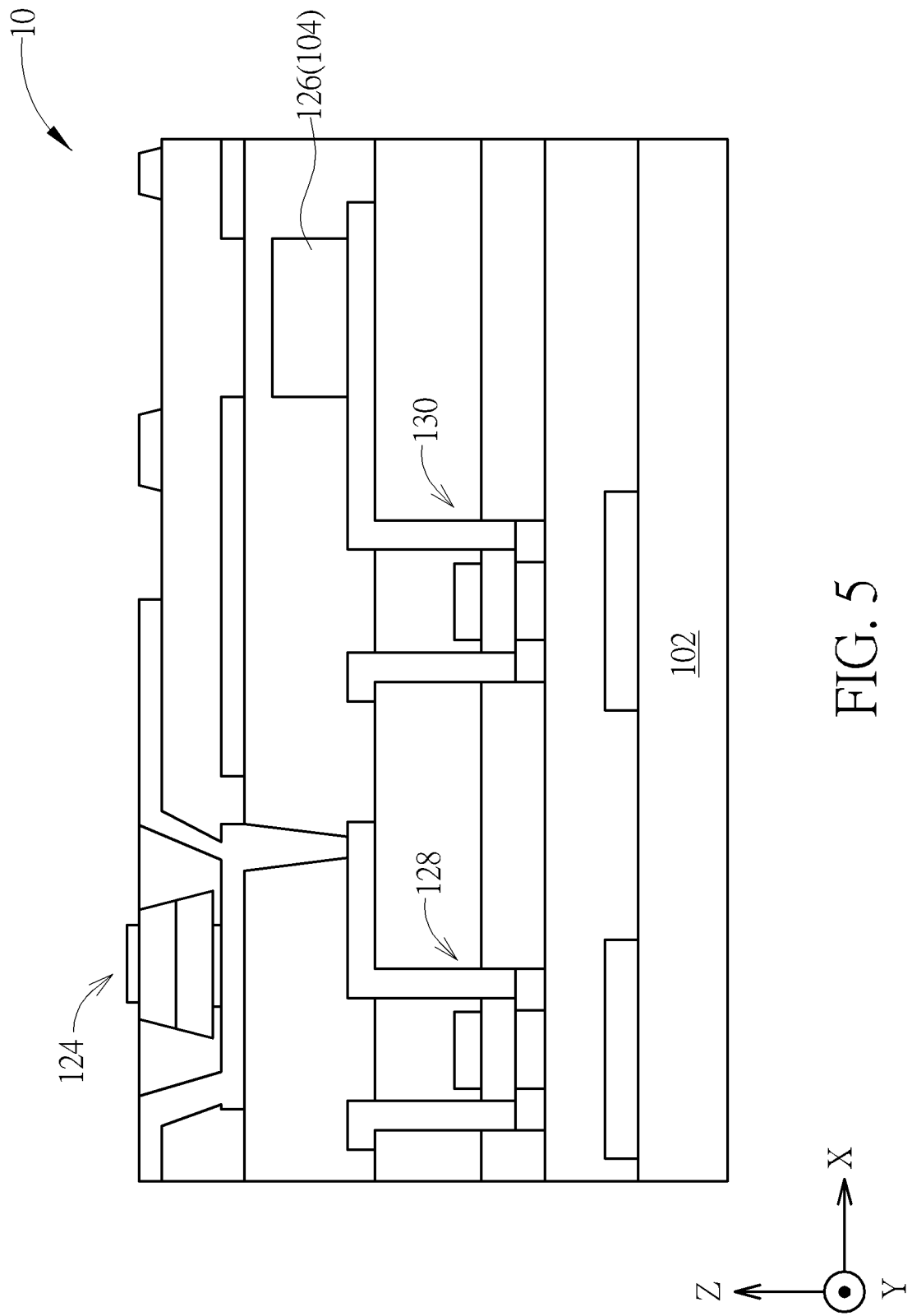

In some embodiments, the sensing units 104 may include optical sensors, but not limited herein. As shown in FIG. 5, the flexible electronic device 10 may include at least one light-emitting element 124 and at least one optical sensor 126 disposed on the flexible substrate 102. The type of the light-emitting elements 124 may be referred to the previous paragraphs, and will not be described redundantly. As shown in FIG. 5, the light-emitting element 124 may include an inorganic light-emitting diode, such as a light-emitting diode, but not limited herein. The optical sensor 126 may include a photodiode, such as a PIN photodiode, but not limited herein. In some embodiments, one optical sensor 126 may be used as one sensing unit 104, and an area of one sensing unit 104 may be an area of one optical sensor 126 viewed from the direction Z, but not limited herein. The flexible electronic device 10 may further include at least one thin film transistor 128 and at least one thin film transistor 130. The thin film transistor 128 may be disposed between the light-emitting element 124 and the flexible substrate 102, and the thin film transistor 130 may be disposed between the optical sensor 126 and the flexible substrate 102. The thin film transistor 128 may be electrically connected to the light-emitting element 124, and the thin film transistor 130 may be electrically connected to the optical sensor 126, but not limited herein.

In some embodiments, the sensing units 104 may include pressure sensors, but not limited herein. As shown in FIG. 6, the pressure sensor may include a piezoelectric material layer 132, an insulating layer 134, an insulating layer 136, a plurality of electrodes 138 and a plurality of electrodes 140, but not limited herein. The piezoelectric material layer 132 may be disposed between the plurality of electrodes 138 and the plurality of electrodes 140. The piezoelectric material layer 132 may be disposed between the insulating layer 134 and the insulating layer 136, the electrodes 138 may be disposed between the piezoelectric material layer 132 and the insulating layer 134, and the electrodes 140 may be disposed between the piezoelectric material layer 132 and the insulating layer 136. In addition, the electrode 140 may be overlapped with the electrode 138 in the direction Z, but not limited herein. In some embodiments, one electrode 140 or one electrode 138 may be used as one sensing unit 104, and an area of one sensing unit 104 may be an area of one electrode 140 or an area of one electrode 138 viewed from the direction Z, but not limited herein. In other embodiments, the sensing units 104 may include electromagnetic sensors, but not limited herein.

Please refer to FIG. 1. The flexible substrate 102 may have an inclined side 102i, and an included angle a may exist between the inclined side 102i and a horizontal direction (e.g., the direction X). In some embodiments, a length of the inclined side 102i may be greater than or equal to 0.53 mm and less than or equal to 2.87 mm, the included angle a may be greater than or equal to 10 degrees and less than or equal to 70 degrees, and the number of the sensing units 104 disposed on the inclined side 102i may be greater than or equal to 0.2 and less than or equal to 1.9, so that the user experience and reliability of the flexible electronic device 10 may be improved, but not limited herein.

In some embodiments, the length of the inclined side 102i may be less than 0.53 mm or the included angle a may be greater than 70 degrees, and the number of the sensing units 104 may be less than 0.2, which may cause the sensing units 104 on the inclined side 102i to be easily damaged. In some embodiments, the length of the inclined side 102i may be greater than 2.87 mm or the included angle a may be less than 10 degrees, and the number of the sensing units 104 may be greater than 1.9, so that the deformation effect may be poor, which may make the user's finger feel the deformation region 106 less easily. However, in the present disclosure, the design of size described above may still be made according to practical requirements.

In some embodiments, the flexible substrate 102 may be a complete substrate without an opening disposed therein (as shown in FIG. 1), but not limited herein. In other embodiments, the flexible substrate 102 may have an opening disposed therein (as shown FIG. 11, etc.), but not limited herein. The flexible substrate 102 may include flexible or stretchable materials. For example, the flexible substrate 102 may include a polymer material, such as polyimide (PI), polyethylene terephthalate (PET), other suitable materials or a combination of the above materials, but not limited herein. The flexible substrate 102 may be a substrate used for carrying the sensing units 104 and may not include the circuit layer above it, but not limited herein.

In some embodiments, the protruding unit 100 may include an actuator, and the actuator is configured to provide haptic feedback, but not limited herein. For example, the protruding unit 100 of FIG. 1 may be stuck out in the direction Z by the actuator to generate haptic feedback, and the deformation region 106 is capable of being stuck out by the protruding unit 100, but not limited herein. The actuator may include a motor or other elements capable of generating vibration, but not limited herein.

According to some embodiments, the protruding unit 100 may be an actuator as an example for illustration. For example, the flexible substrate 102 is not stuck out by the actuator (protruding unit 100) when the actuator is not started, so the flexible substrate 102 may be flat at this time. The flexible substrate 102 may be stuck out by the actuator (protruding unit 100) when the actuator is started, so that the flexible substrate 102 forms the deformation region 106, but not limited herein. In other words, the portion of the flexible substrate 102 that is stuck out by the protruding unit 100 is the deformation region 106. In other embodiments, the position of the protruding unit 100 may be designed to be fixed, and the protruding unit 100 does not need to be started. That is to say, the flexible substrate 102 is stuck out by the protruding unit 100 to form the deformation region 106 when the flexible substrate 102 is initially disposed on the protruding unit 100, but not limited herein.

According to some embodiments, a portion of the flexible substrate 102 can be stuck out by the protruding unit 100, and the user may easily touch and feel the protruding portion of the flexible substrate 102. Therefore, the sensing unit 104 corresponding to the protruding unit 100 may be easily touched, thereby enhancing the correctness of sensing.

Figure 7:
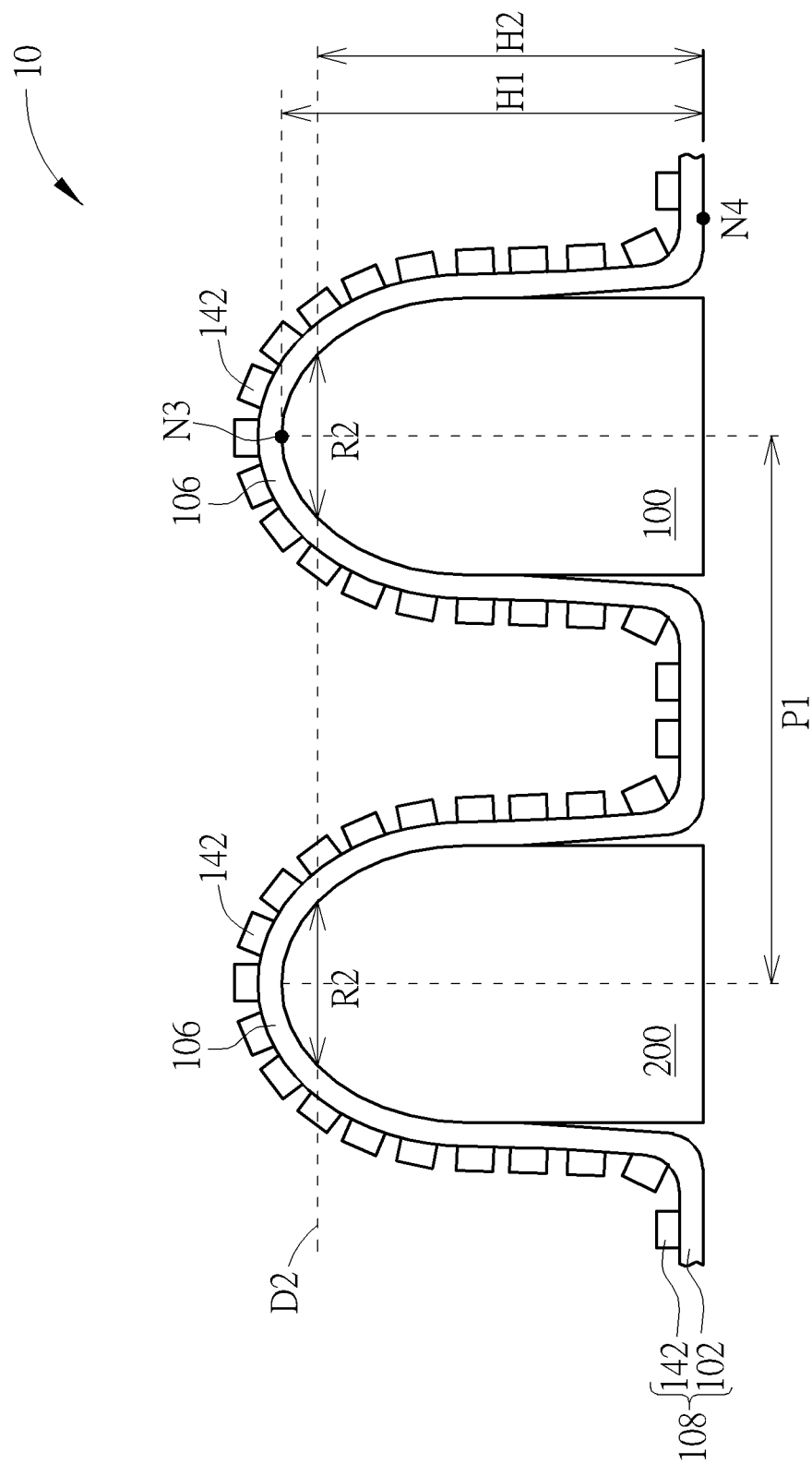
FIG. 7 is a cross-sectional view schematic diagram of a flexible electronic device according to a second embodiment of the present disclosure.

Other embodiments of the present disclosure will be disclosed in the following. In order to simplify the illustration, the same elements in the following would be labeled with the same symbol. For clearly showing the differences between various embodiments, the differences between different embodiments are described in detail below, and repeated features will not be described redundantly. In order to highlight the relevant features of other elements in the flexible electronic device 10, the sensing units 104 in the flexible electronic device 10 may be omitted in the following drawings (as shown in FIG. 7, etc.). However, the flexible electronic device 10 in the following drawings may still include the sensing units 104 in the flexible electronic device 10 of the first embodiment, and the functions that the flexible electronic devices of the following embodiments may achieve may be referred to the functions of the first embodiment described above, which will not be described redundantly herein.

Figure 8:
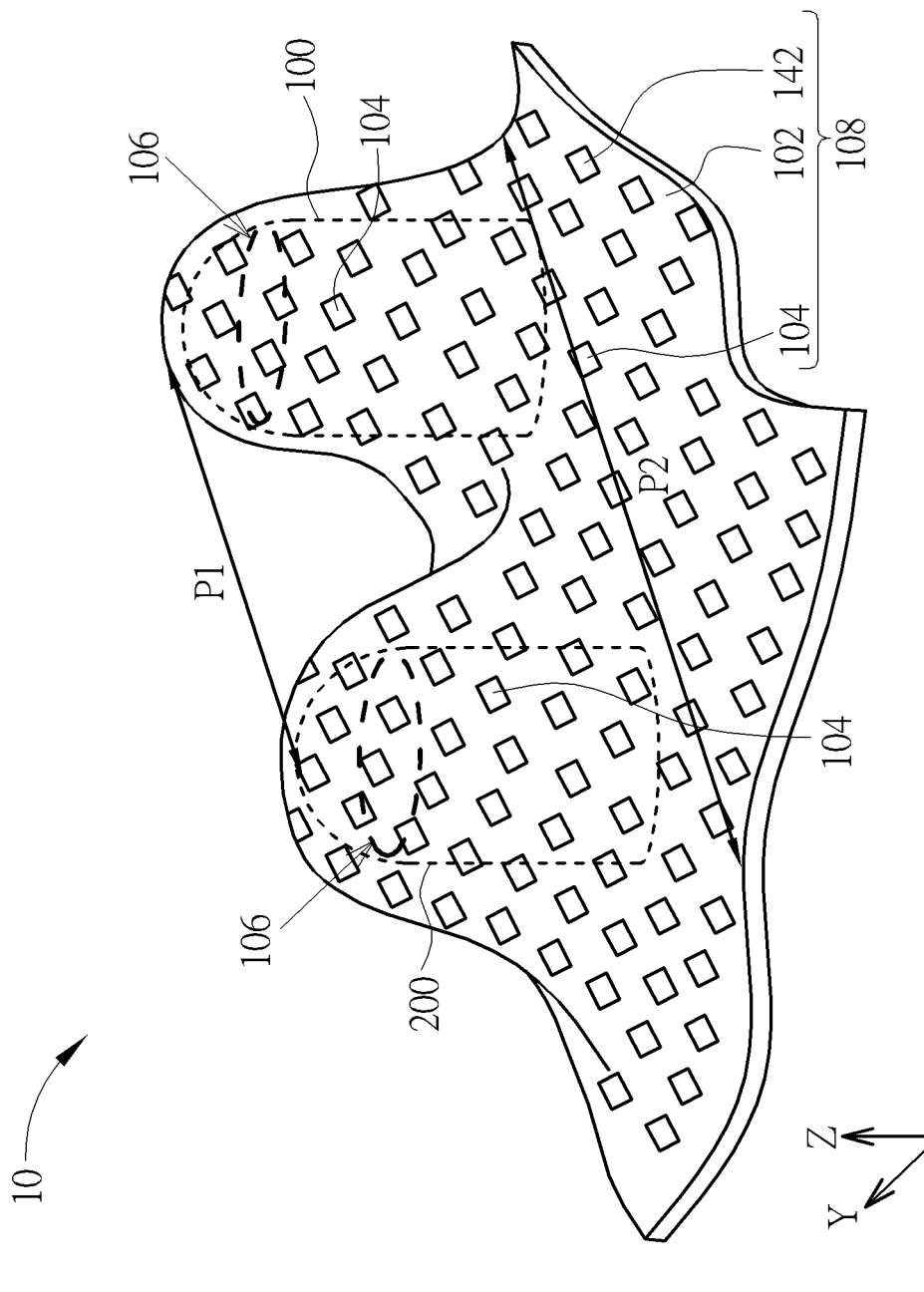
FIG. 8 is a three-dimensional schematic diagram of the flexible electronic device according to the second embodiment of the present disclosure.

Please refer to FIG. 7 and FIG. 8. FIG. 7 is a cross-sectional view schematic diagram of a flexible electronic device according to a second embodiment of the present disclosure. FIG. 8 is a three-dimensional schematic diagram of the flexible electronic device according to the second embodiment of the present disclosure. In some embodiments, the flexible electronic device 10 may include a plurality of protruding units, such as a protruding unit 100 and a protruding unit 200, but not limited herein. As shown in FIG. 7, the cross-sectional shapes of the protruding unit 100 and the protruding unit 200 may be bullet-shaped, but not limited herein. In some embodiments, the protruding unit 100 and the protruding unit 200 may have different shapes or sizes.

Another method of defining the area of the deformation region 106 may be interpreted through FIG. 7. Taking the protruding unit 100 as an example, a height H1 exists between the highest point N3 of a lower surface of the panel 108 and the lowest point N4 of the lower surface of the panel 108 in the direction Z when the deformation region 106 is stuck out by the protruding unit 100. The lower surface of the panel 108 in FIG. 7 is indicated by a lower surface of the flexible substrate 102, but the present disclosure is not limited herein.

Then, a height H2 may be calculated. The height H2 is 0.9 times the height H1 (i.e. H2=0.9H1), and the height H2 may be measured upward from the lowest point N4 of the lower surface of the panel 108 in the direction Z. In FIG. 7, the position of the height H2 is indicated by a line D2. The line D2 may be a virtual straight line parallel to the direction X, and a range R2 may be defined by the intersections of the line D2 and the lower surface of the panel 108. An area of the projection of the flexible substrate 102 within the range R2 on a plane parallel to the direction X (e.g., a XY-plane, which is a plane defined by the direction X and the direction Y) may be defined as the area of the deformation region 106 of the flexible substrate 102. The deformation region 106 is also shown in FIG. 8. In addition, the definition of the area of the deformation region 106 described above may be applied to other embodiments of the present disclosure.

As shown in FIG. 7 and FIG. 8, the flexible electronic device 10 may further include a plurality of electronic units 142 disposed on the flexible substrate 102. According to some embodiments, a ratio of the area of the deformation region 106 to an area of one of the plurality of electronic units 142 may be greater than or equal to 53.08 and less than or equal to 1000000, but not limited herein.

According to some embodiments, the electronic unit 142 may be a display unit. According to some embodiments, the electronic unit 142 may be a non-display unit with no display function. For convenience of illustration, the electronic unit 142 is a display unit 142 as an example for illustration in the following. The flexible electronic device 10 may include the panel 108, and the panel 108 may include the flexible substrate 102, a plurality of display units 142 and a plurality of sensing units 104 (not shown in FIG. 7), but the present disclosure is not limited herein. In addition, at least one of the plurality of display units 142 may be overlapped with the deformation region 106. For example, the least one of the plurality of display units 142 may be overlapped with the deformation region in the direction Z. In some embodiments, a portion of one of the display units 142 may be overlapped with the deformation region 106, but not limited herein. In some embodiments, one of the display units 142 may be completely overlapped with the deformation region 106, but not limited herein.

For convenience of illustration, merely a plurality of display units 142 are shown on the flexible substrate 102 in FIG. 7. However, it should be understood that a plurality of sensing units 104 may also be disposed on the flexible substrate 102, as shown in FIG. 1. According to some embodiments, as shown in FIG. 8, a plurality of display units 142 and a plurality of sensing units 104 may be disposed on the flexible substrate 102. For convenience of illustration, the small squares shown in FIG. 8 may indicate the plurality of display units 142 and the plurality of sensing units 104. The number of the display units 142 and the number of the sensing units 104 are not limited. The number of the display units 142 may be the same as or different from the number of the sensing units 104 within a given area. For example, according to some embodiments, the number of the display units 142 may be greater than the number of the sensing units 104. The area of the display unit 142 and the area of the sensing unit 104 are not limited and may be the same or different. For example, according to some embodiments, the area of the display unit 142 may be less than the area of the sensing unit 104. For example, according to some embodiments, the area of the display unit 142 may be greater than the area of the sensing unit 104.

In some embodiments, the area of the deformation region 106 may be greater than or equal to 26.01 square millimeters and less than or equal to 10000 square millimeters. Among at least one of the display units 142 overlapped with the deformation region 106, the area of one of the display units 142 may be greater than or equal to 0.01 square millimeters and less than or equal to 0.49 square millimeters. Furthermore, a ratio of the area of the deformation region 106 to the area of one of the plurality of display units 142 may be greater than or equal to 53.08 and less than or equal to 1000000, but not limited herein. In some embodiments, the amount of the display units 142 included in the area of the smallest deformation region 106 may be at least 53.08, and the display units 142 may be less easily to be damaged by the stress generated by the deformation.

In some embodiments, a display unit 142 may be a pixel, and a pixel may include a plurality of sub-pixels. One pixel may include sub-pixels of different colors, such as including red sub-pixels, green sub-pixels and blue sub-pixels, but not limited herein. In the condition that the flexible electronic device 10 is an organic light-emitting diode display device, the sub-pixel may include an anode, an organic light emitting layer and a portion of a cathode. In the condition that the flexible electronic device 10 is an inorganic light-emitting diode display device, the sub-pixel may include a light-emitting element, such as a light-emitting diode. The type of the light-emitting element may be referred to the paragraphs above, but not limited herein. In the condition that the flexible electronic device 10 is a liquid crystal display device, the sub-pixel may include a pixel electrode, a portion of liquid crystal and a portion of a common electrode.

According to some embodiments, for example, one display unit 142 may include a rectangular region, an area of this rectangular region may be the product of two sides perpendicular to each other, one of the sides may be a pitch between one sub-pixel and the next sub-pixel of the same color in a direction, and the other of the sides may be a pitch between the sub-pixel and the next sub-pixel of the same color in another direction. The two directions described above may be perpendicular to each other, and the area of this rectangular region may be used as the area of the display unit 142, but not limited herein.

As shown in FIG. 8, the protruding unit 100 and the protruding unit 200 may be disposed along a direction (e.g., the direction X). The protruding unit 100 and the protruding unit 200 may have a pitch P1 in the direction X, the flexible substrate 102 may have a length P2 in the direction X, and the pitch P1 may be greater than or equal to 3 centimeters (cm) and less than or equal to 0.8 times of the length P2, so that the user experience of the flexible electronic device 10 may be improved, but not limited herein. In some embodiments, the pitch P1 may be less than 3 cm, and the deformations of the protruding unit 100 and the protruding unit 200 may be more easily interfered with each other. In some embodiments, the pitch P1 may be greater than 0.8 times of the length P2, and the deformation effect of the protruding unit 100 and the protruding unit 200 may be poor. However, in the present disclosure, the design of size described above may still be made according to practical requirements.

Figure 9:
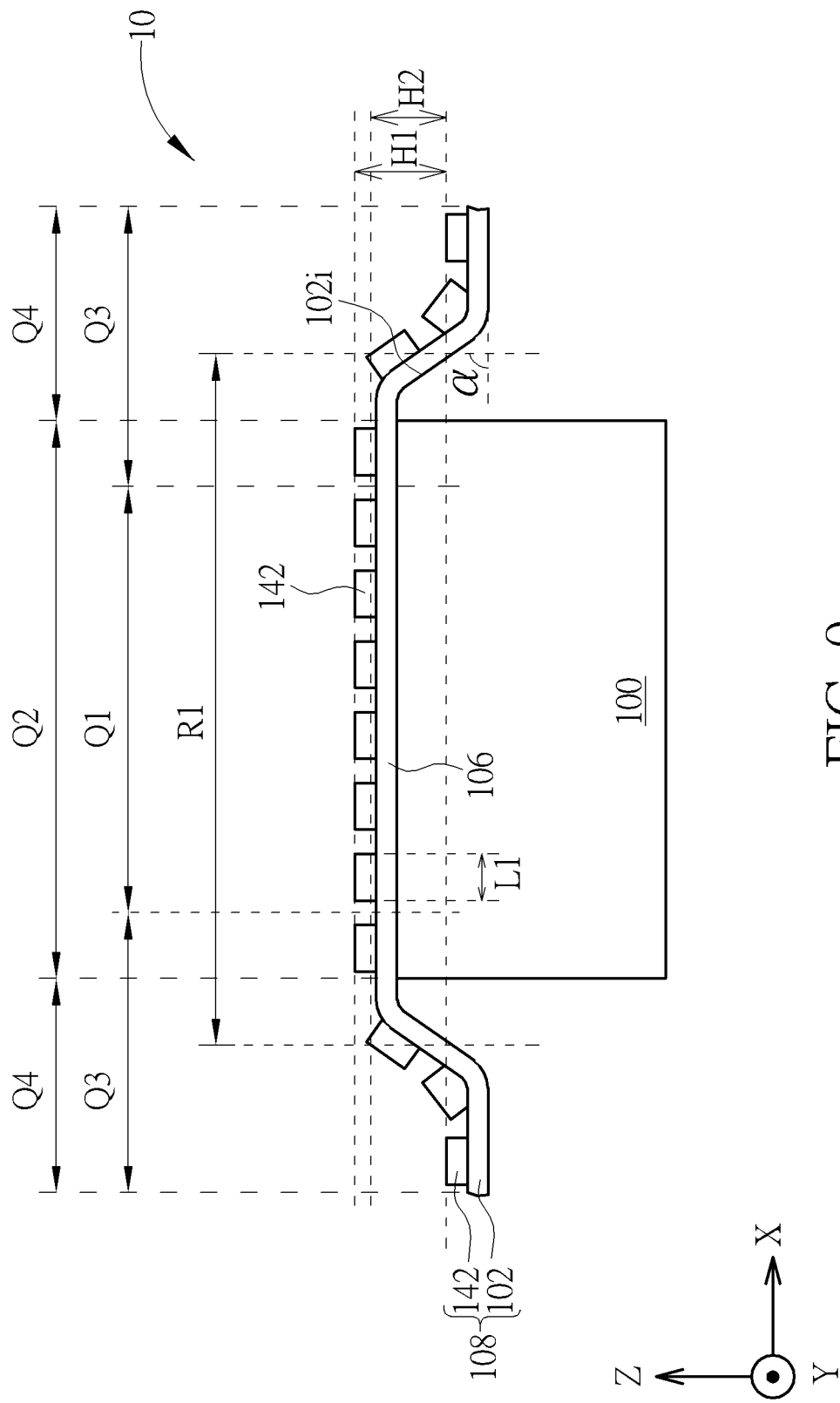
FIG. 9 is a cross-sectional view schematic diagram of a flexible electronic device according to a third embodiment of the present disclosure.

Please refer to FIG. 9, which is a cross-sectional view schematic diagram of a flexible electronic device according to a third embodiment of the present disclosure. In some embodiments, the cross-sectional shape of the protruding unit 100 may be rectangular, and the display units 142 are disposed on the flexible substrate 102, but not limited herein. An upper surface of the display unit 142 in FIG. 9 may be used as an upper surface of the panel 108, and a height H1 exists between the highest point of the upper surface of the display unit 142 and the lowest point of the upper surface of the display unit 142 in the direction Z. A height H2 may be measured upward from the lowest point of the upper surface of the display unit 142 in the direction Z, but the present disclosure is not limited herein. The definition of the deformation region 106 in FIG. 9 is the same as definition of the deformation region 106 in FIG. 1 in the first embodiment, which may be referred to the above description, and will not be described redundantly herein.

In some embodiments, a length of the inclined side 102$i$ may be greater than or equal to 0.53 mm and less than or equal to 2.87 mm, but not limited herein. A length L1 of the display unit 142 may be, for example, about 0.115 mm when the display unit 142 has a smaller size, but not limited herein. The length L1 of the display unit 142 may be, for example, about 0.628 mm when the display unit 142 has a larger size, but not limited herein. Therefore, the number of the display units 142 disposed on the inclined side 102$i$ may be greater than or equal to 0.8 and less than or equal to 25, so that the user experience and reliability of the flexible electronic device 10 may be improved, but not limited herein.

In some embodiment, the length of the inclined side 102$i$ may be less than 0.53 mm or the included angle a may be greater than 70 degrees, and the number of the display units 142 may be less than 0.8, which may cause the display units 142 on the inclined side 102$i$ to be easily damaged. In some embodiments, the length of the inclined side 102$i$ may be greater than 2.87 mm or the included angle a may be less than 10 degrees, and the number of the display units 142 may be greater than 25, resulting in the deformation effect may be poor at this time, which may make the user's finger feel the deformation region 106 less easily. However, in the present disclosure, the design of size described above may still be made according to practical requirements.

In some embodiments, the flexible electronic device 10 may include a central region Q1 and a plurality of side regions Q3. As shown in FIG. 9, the central region Q1 may be disposed between two side regions Q3 in the direction X, but not limited herein. The side region Q3 may include a curved portion of the flexible substrate 102, a portion of a flat portion adjacent to the curved portion and display units 142 disposed on the above portions, and the central region Q1 may include the remaining portion of the flat portion of the flexible substrate 102 and display units 142 disposed on this portion, but not limited herein. The display units 142 in the central region Q1 may be turned on, and the display units 142 in the side regions Q3 may be turned off, so that the range that emits light may be smaller than the protruding range. Therefore, the display units 142 in the side regions Q3 may be prevented from causing halo due to different viewing angles of emitted light.

In some embodiments, the flexible electronic device 10 may include a central region Q2 and a plurality of side regions Q4. As shown in FIG. 9, the central region Q2 may be disposed between two side regions Q4 in the direction X, but not limited herein. The side region Q4 may include a curved portion of the flexible substrate 102 and display units 142 disposed on this portion, and the central region Q2 may include a flat portion of the flexible substrate 102 and display units 142 disposed on this portion, but not limited herein. The display units 142 in the central region Q2 may be turned off, and the display units 142 in the side regions Q4 may be turned on, so that the edge of the protruding range emits light. Therefore, when the flexible electronic device 10 is used as a button, the range of the button may be highlighted in an annular shape, but not limited herein.

Figure 10:
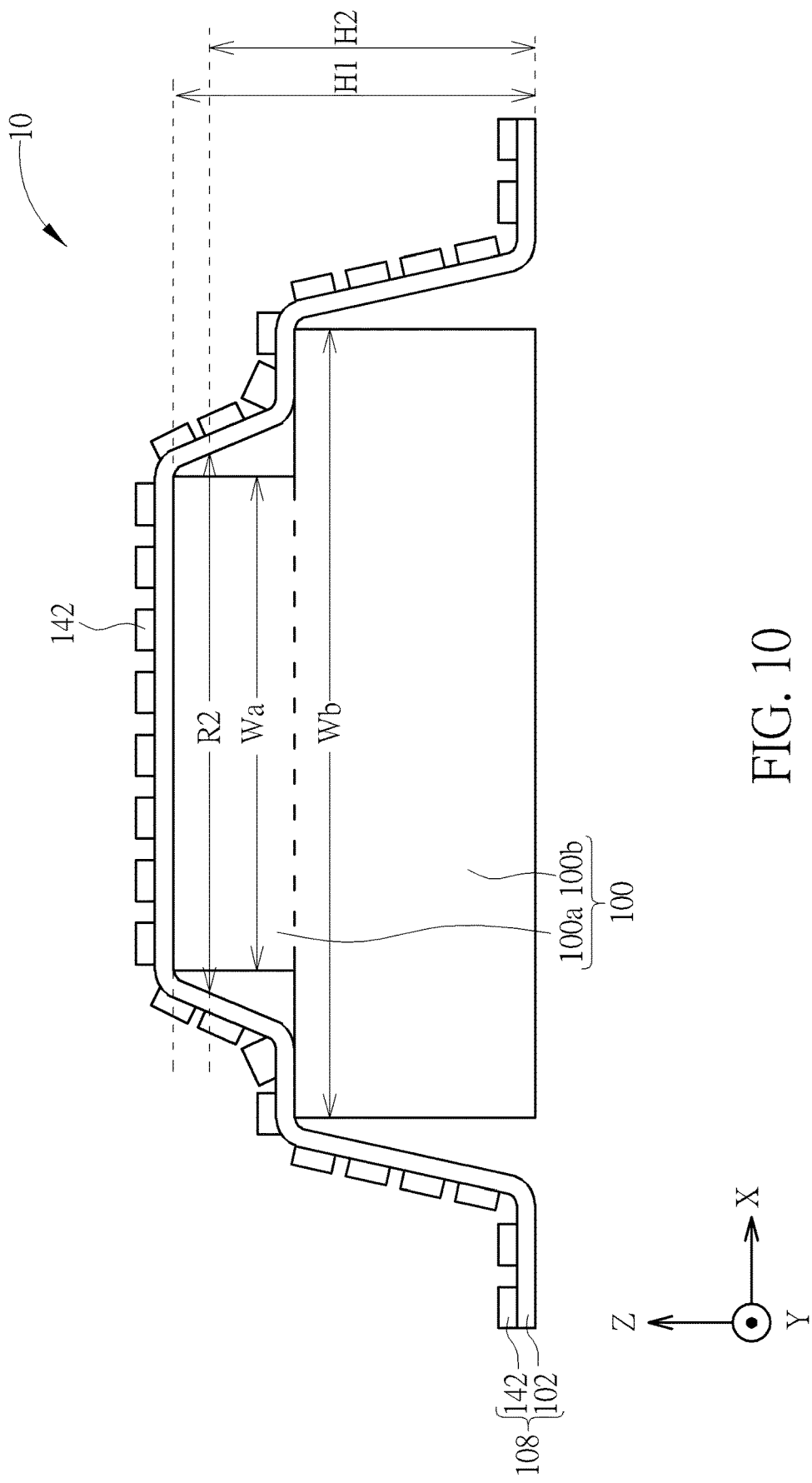
FIG. 10 is a cross-sectional view schematic diagram of a flexible electronic device according to a fourth embodiment of the present disclosure.

Please refer to FIG. 10, which is a cross-sectional view schematic diagram of a flexible electronic device according to a fourth embodiment of the present disclosure. The protruding unit 100 of the present disclosure may have different shapes according to different designs. For example, in some embodiments, a protruding unit 100 may include a portion 100$a$ and a portion 100$b$, and the portion 100$a$ may be disposed on the portion 100$b$ in the direction Z, but not limited herein. The portion 100$a$ may have a width Wa in the direction X, the portion 100$b$ may have a width Wb in the direction X, and the width Wa may be different from the width Wb. For example, the width Wb may be greater than the width Wa, but not limited herein.

Figure 11:
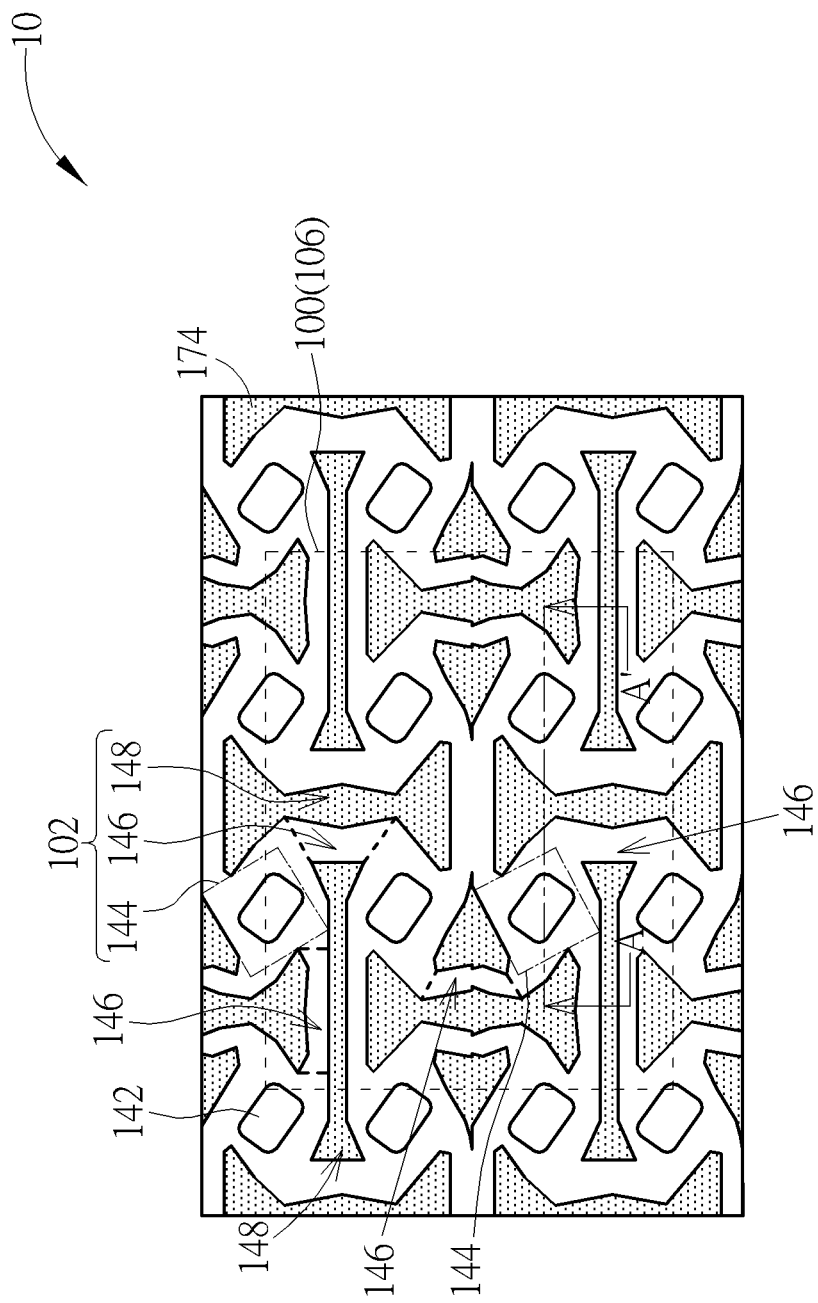
FIG. 11 is a top-view schematic diagram of a portion of a flexible electronic device according to a fifth embodiment of the present disclosure.
Figure 12:
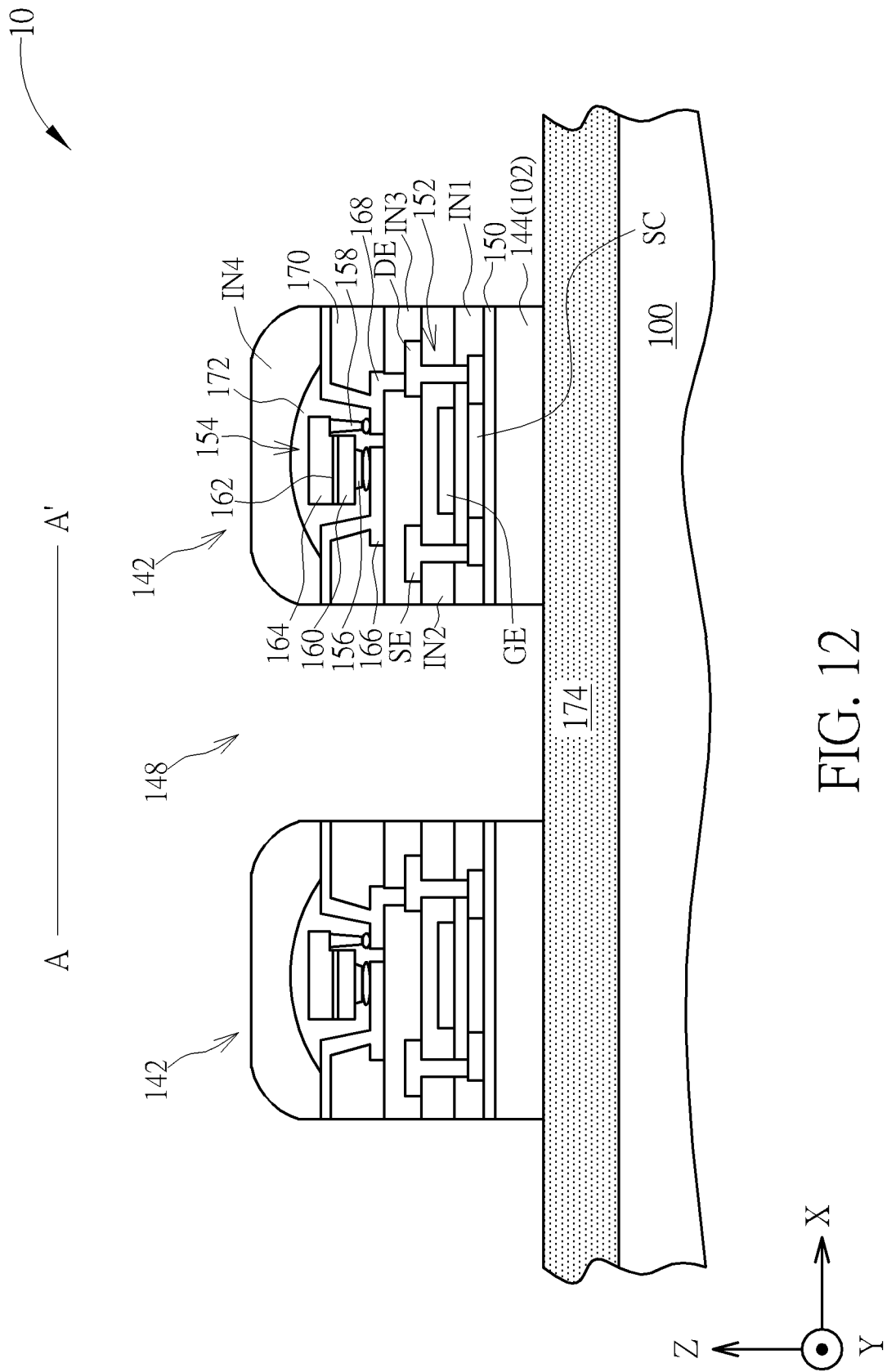
FIG. 12 is a cross-sectional view schematic diagram corresponding to the section line A-A' of FIG. 11.

Please refer to FIG. 11 and FIG. 12. FIG. 11 is a top-view schematic diagram of a portion of a flexible electronic device according to a fifth embodiment of the present disclosure. FIG. 12 is a cross-sectional view schematic diagram corresponding to the section line A-A' of FIG. 11. In some embodiments, the flexible substrate 102 may include a patterned substrate. For example, the flexible substrate 102 may include a plurality of main portions 144 and a plurality of connecting portions 146, and one of the main portions 144 may be disposed between two adjacent connecting portions 146. According to some embodiments, two adjacent ones of the plurality of main portions 144 are connected to each other. In detail, two adjacent main portions 144 may be connected to each other through one of the connecting portions 146, but not limited herein. In addition, the flexible substrate 102 may include a plurality of openings 148, and the openings 148 may be surrounded by the main portions 144 and the connecting portions 146, but not limited herein. In some embodiments, the entire flexible substrate 102 may be patterned to have a plurality of openings 148, a plurality of main portions 144 and a plurality of connecting portions 146, but not limited herein. In the flexible substrate 102 of some embodiments, the openings 148 of different shapes and sizes may be designed according to requirements.

In addition, the deformation region 106 may include at least one of the plurality of main portions 144. In some embodiments, as shown in FIG. 11, the deformation region 106 may include a plurality of main portions 144. In the flexible substrate 102, the range of one main portion 144 may be a unit that the display unit 142 is disposed on, and the openings 148 adjacent to the main portion 144 may define the boundary of the main portion 144. For example, in the flexible substrate 102, a rectangular unit (such as the portion framed by the dotted line in FIG. 11) including the display unit 142 may be the range of the main portion 144, and the openings 148 adjacent to the main portion 144 may define the boundary of the main portion 144. For example, at least one side or at least one corner of the rectangular unit may intersect the boundary of the corresponding opening 148. For example, as shown in FIG. 11, three sides of the rectangular unit framed by dotted line intersect the boundaries of the corresponding three openings 148, but the present disclosure is not limited herein. Therefore, in some embodiments, an area of one main portion 144 may be an area of the rectangular unit on the flexible substrate 102 that the display unit 142 is disposed on, and the boundary of the rectangular unit may be defined by the corresponding openings 148.

In some embodiments, an area of the deformation region 106 may be greater than or equal to 26.01 square millimeters and less than or equal to 10000 square millimeters. An area of one of the plurality of main portions 144 may be greater than or equal to 0.02 square millimeters and less than or equal to 1 square millimeter. In some embodiments, a ratio of the area of the deformation region 106 to the area of one of the plurality of main portions 144 may be greater than or equal to 26.01 and less than or equal to 500000, but not limited herein. Thus, the display units 142 are not easily damaged by the stress generated by the deformation when the flexible substrate 102 is deformed (e.g., when the flexible substrate 102 is stuck out by the protruding unit). Furthermore, the sensing units 104 are not easily damaged by the stress generated by deformation and may correctly sense. When the flexible substrate 102 is stuck out by the protruding unit 100 to form the deformation region 106, the following conditions may occur: the shape and/or the size of the openings 148 may be changed, the relative positions of the main portions 144 may be changed, the connecting portions 146 may be elongated, or a combination of the above conditions may occur, but not limited herein.

In some embodiments, one or plural display units 142 may be disposed on one main portion 144. As shown in FIG. 11, one display unit 142 may be disposed on one main portion 144, but not limited herein. No display unit 142 is disposed on the connecting portion 146. The sensing units 104 are not shown in FIG. 11 and FIG. 12, but one or plural sensing units 104 or at least a portion of one sensing unit 104 may be disposed on one of the main portions 144.

The structure of one sub-pixel in the display unit 142 on the main portion 144 is illustrated, for example, in the following, but the present disclosure is not limited herein. FIG. 12 is a cross-sectional view schematic diagram corresponding to the section line A-A' of FIG. 11, which shows the structures on two main portions 144. The display unit 142 may include a plurality of sub-pixels, such as three sub-pixels. FIG. 12 merely shows the structure of one sub-pixel in the display unit 142 respectively on two main portions 144. The display unit 142 may include a light-emitting element 154 and a driving element 152. The driving element 152 may be electrically connected to the light-emitting element 154. For example, the driving element 152 may be a thin film transistor.

The structure on the main portion 144 is detailed in the following. A buffer layer 150 may be disposed on the main portion 144, and a thin film transistor 152 may be disposed on the buffer layer 150. The thin film transistor 152 may include a gate GE, a source SE, a drain DE and a semiconductor layer SC. The semiconductor layer SC may be disposed on the buffer layer 150, an insulating layer IN1 may be disposed on the semiconductor layer SC, the gate GE may be disposed on the insulating layer IN1, and an insulating layer IN2 may be disposed on the gate GE. The source SE and the drain DE may be disposed on the insulating layer IN2 and electrically connected to the semiconductor layer SC. An insulating layer IN3 may be disposed on the source SE and the drain DE, and the light-emitting element 154 may be disposed on the insulating layer IN3.

The light-emitting elements 154 in FIG. 12 may be light-emitting diodes as an example, but the present disclosure is not limited herein. The light-emitting element 154 may include a first electrode 156, a second electrode 158, a first semiconductor layer 160, a light-emitting layer 162 and a second semiconductor layer 164. The light-emitting layer 162 may be, for example, a multiple quantum well (MQW) layer, but not limited herein. The first electrode 156 may be electrically connected to a common electrode (not shown) through a bonding pad 166. The second electrode 158 may be electrically connected to the drain DE through a bonding pad 168.

A pixel definition layer 170 may be disposed on the insulating layer IN3, and the light emitting element 154 may be disposed in an opening of the pixel definition layer 170. A protective layer 172 may cover the light emitting element 154, and the protective layer 172 may protect the light emitting element 154, so as to reduce the influence of air or humidity, for example. In addition, an insulating layer IN4 may be disposed on the protective layer 172.

In some embodiments (as shown in FIG. 11 and FIG. 12), the flexible electronic device 10 may include a middle substrate 174 disposed between the flexible substrate 102 and the protruding unit 100, but not limited herein. The middle substrate 174 may include elastic, stretchable or bendable materials, but not limited herein. For example, the middle substrate 174 may include silicone rubber or elastomer, the silicone rubber may include polydimethylsiloxane (PDMS), and the elastomer may include polyurethane (PU) or polytetrafluoroethylene (PTFE), but not limited herein. The middle substrate 174 may reduce the probability of causing damage to the flexible electronic device 10 during deformation. According to some embodiments, an area of the middle substrate 174 may be greater than an area of the protruding unit 100, and the area of the protruding unit 100 may be greater than an area of the main portion 144, but not limited herein.

Figure 13:
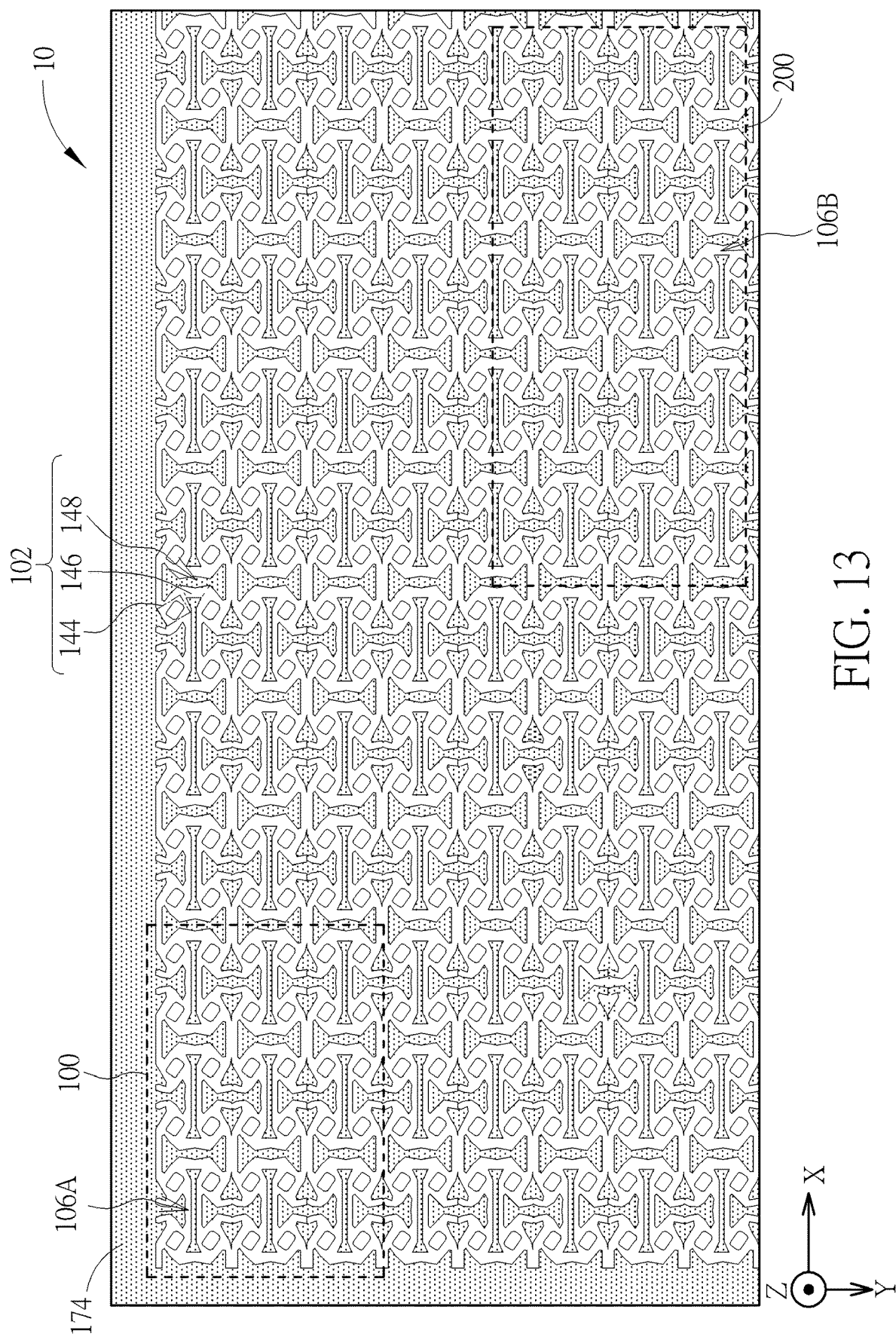
FIG. 13 is a top-view schematic diagram of a flexible electronic device according to a sixth embodiment of the present disclosure.

Please refer to FIG. 13, which is a top-view schematic diagram of a flexible electronic device according to a sixth embodiment of the present disclosure. In some embodiments, the flexible electronic device 10 may include a plurality of protruding units, such as a protruding unit 100 and a protruding unit 200. The flexible substrate 102 includes a deformation region 106A and a deformation region 106B. The deformation region 106A corresponds to the protruding unit 100, and the deformation region 106B corresponds to the protruding unit 200. An area of the deformation region 106B may be different from an area of the deformation region 106A. For example, the area of the deformation region 106B may be greater than the area of the deformation region 106A, but not limited herein. In addition, in the direction Z, the number of the main portions 144 corresponding to (or overlapped with) the protruding unit 200 is different from the number of the main portions 144 corresponding to (or overlapped with) the protruding unit 100. For example, the number of the main portions 144 corresponding to (or overlapped with) the protruding unit 200 may be greater than the number of the main portions 144 corresponding to (or overlapped with) the protruding unit 100, but not limited herein.

Figure 14:
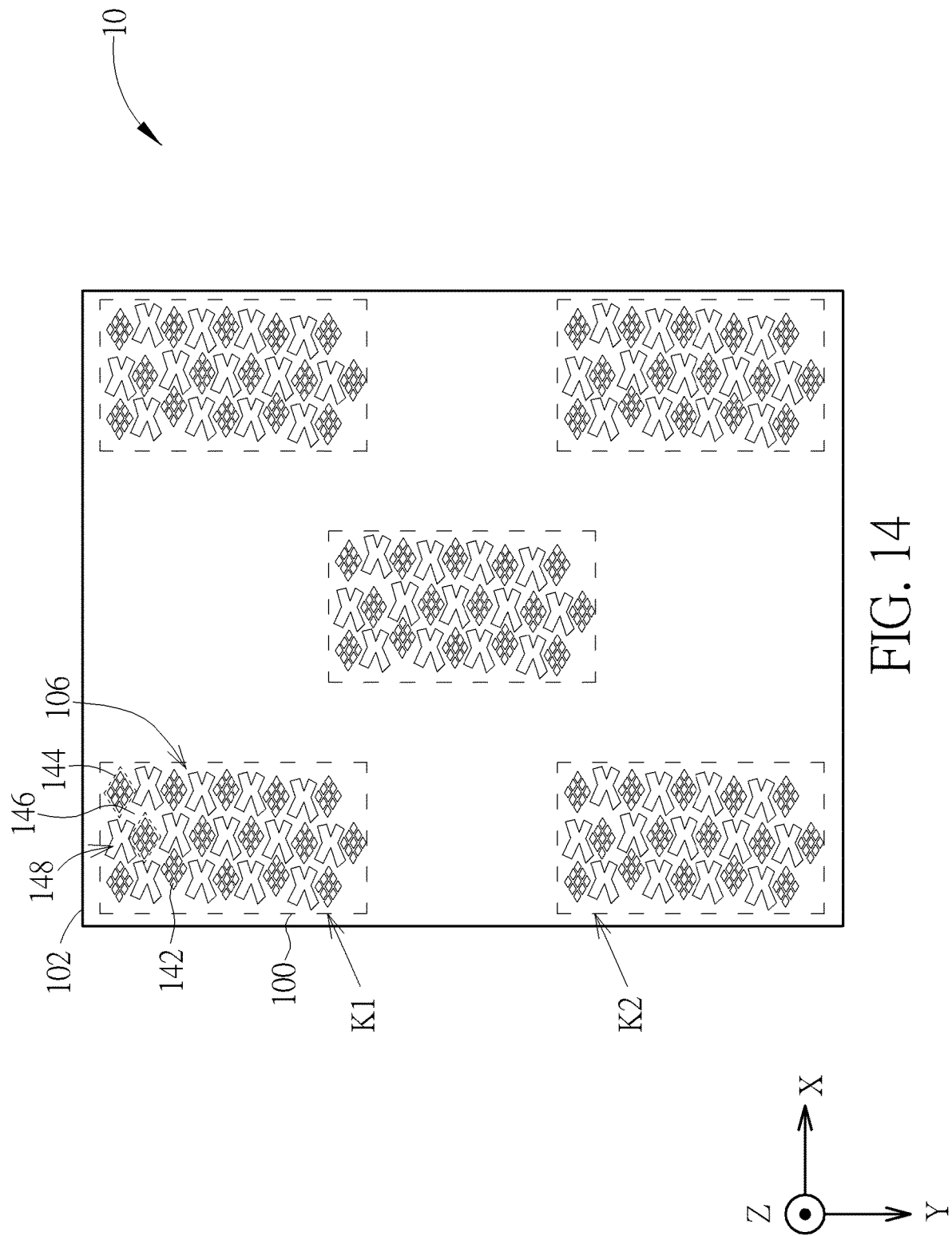
FIG. 14 is a top-view schematic diagram of a flexible electronic device according to a seventh embodiment of the present disclosure.

Please refer to FIG. 14, which is a top-view schematic diagram of a flexible electronic device according to a seventh embodiment of the present disclosure. In order to highlight the features of this embodiment, the middle substrate 174 is omitted in FIG. 14. In some embodiments, the flexible substrate 102 may include one or plural patterned portions (such as a patterned portion K1 and a patterned portion K2 in FIG. 14). The patterned portion may include openings 148, main portions 144 and connecting portions 146. The patterned portion may be correspondingly disposed on the protruding unit 100 in the direction Z, and the number of the patterned portions may be the same as the number of the protruding units 100, but the number of the patterned portions and the number of the protruding units 100 of the present disclosure are not limited to those in FIG. 14. In addition, as shown in FIG. 14, a plurality of display units 142 may be disposed on one main portion 144, but not limited herein. Therefore, a portion of the flexible substrate 102 may be patterned and another portion of the flexible substrate 102 may not be patterned, but not limited herein.

Figure 15:
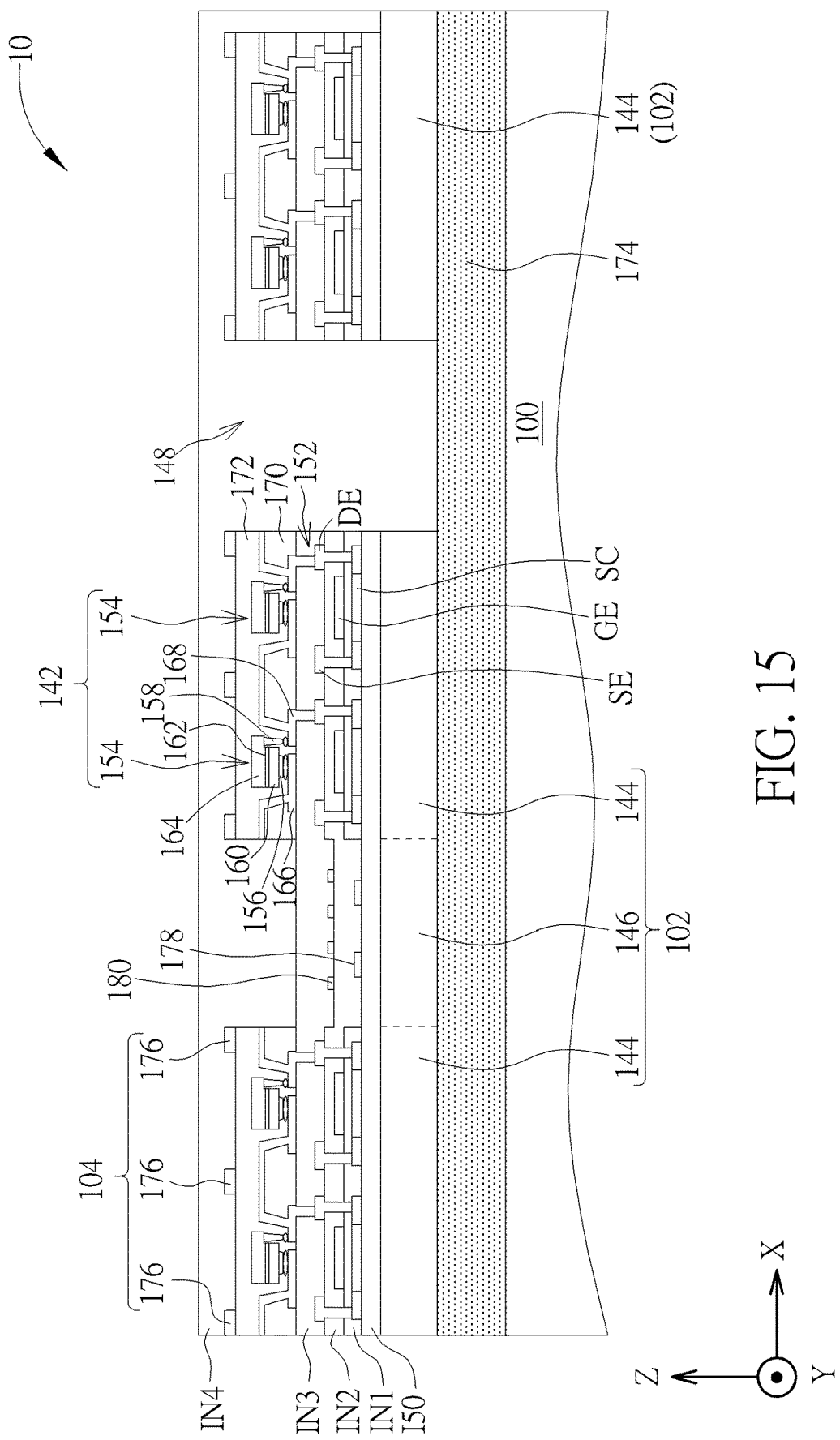
FIG. 15 is a cross-sectional view schematic diagram of a flexible electronic device according to an eighth embodiment of the present disclosure.

Please refer to FIG. 15, which is a cross-sectional view schematic diagram of a flexible electronic device according to an eighth embodiment of the present disclosure. In some embodiments, a plurality of display units 142 may be disposed between the flexible substrate 102 and a plurality of sensing units 104 in the direction Z, but not limited herein. The protective layer 172 may include a flat upper surface, and a plurality of sensing electrodes 176 in the sensing unit 104 may be disposed on the upper surface of the protective layer 172, but not limited herein. In some embodiments, the sensing electrode 176 may be a metal wire in a metal mesh structure, but not limited herein. In some embodiments, a plurality of light-emitting elements 154 may be disposed on one main portion 144, but not limited herein.

The flexible electronic device 10 may further include a plurality of signal lines 178 and a plurality of signal lines 180 disposed on the connecting portion 146. The signal lines 178 may be disposed on the buffer layer 150, the insulating layer IN2 may be disposed on the signal lines 178, and the signal lines 180 may be disposed on the insulating layer IN2, but not limited herein. In addition, the insulating layer IN4 may include elastic filling materials, but not limited herein. The signal lines 178 and the gate GE in the thin film transistor 152 may be formed by the same layer, and the signal lines 180 and the drain DE in the thin film transistor 152 may be formed by the same layer, but not limited herein.

Figure 16:
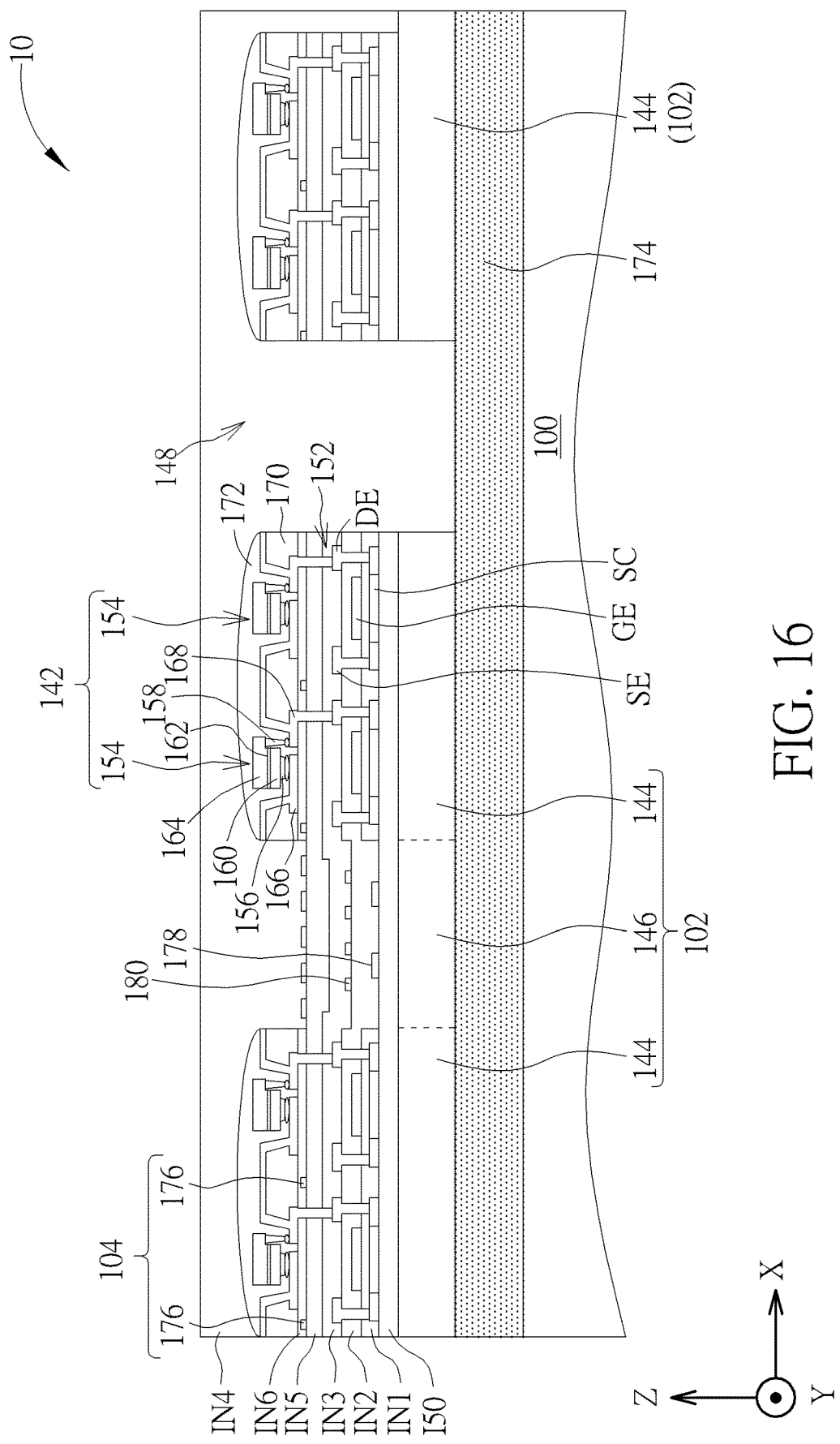
FIG. 16 is a cross-sectional view schematic diagram of a flexible electronic device according to a ninth embodiment of the present disclosure.

Please refer to FIG. 16, which is a cross-sectional view schematic diagram of a flexible electronic device according to a ninth embodiment of the present disclosure. In some embodiments, a plurality of sensing units 104 may be disposed between the flexible substrate 102 and a plurality of display units 142, but not limited herein. The flexible electronic device 10 may further include an insulating layer IN5, and the insulating layer IN5 may be disposed on the insulating layer IN3, but not limited herein. The insulating layer IN5 may include a flat upper surface, and the sensing electrodes 176 in the sensing unit 104 may be disposed on the upper surface of the insulating layer IN5. The sensing electrodes 176 may be disposed on the main portion 144 and the connecting portion 146, but not limited herein. The flexible electronic device 10 may further include an insulating layer IN6 disposed on the insulating layer IN5. A portion of the sensing electrodes 176 may be disposed between the insulating layer IN5 and the insulating layer IN6, and the light-emitting elements 154 may be disposed on the insulating layer IN6, but not limited herein.

Figure 17:
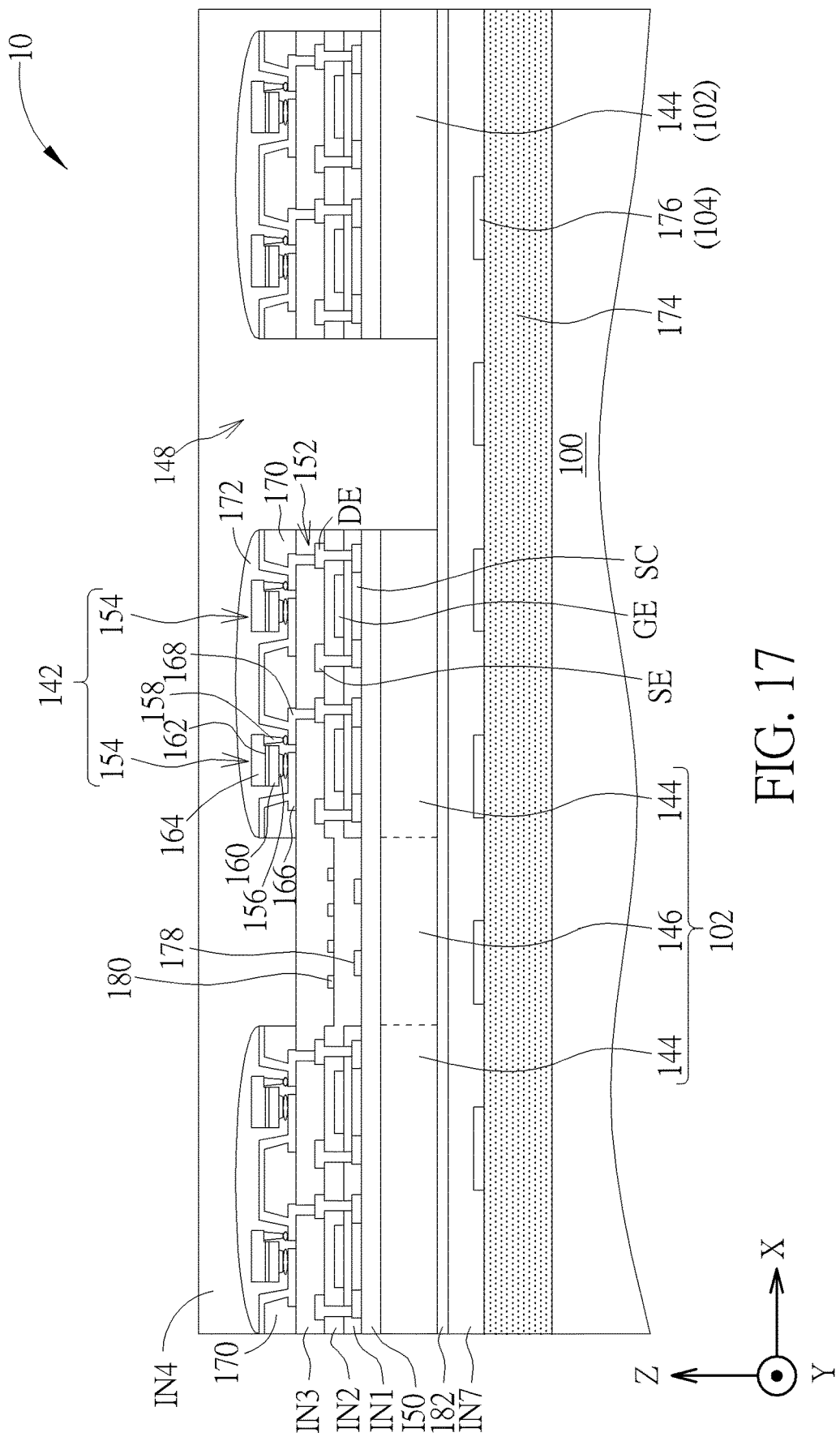
FIG. 17 is a cross-sectional view schematic diagram of a flexible electronic device according to a tenth embodiment of the present disclosure.

Please refer to FIG. 17, which is a cross-sectional view schematic diagram of a flexible electronic device according to a tenth embodiment of the present disclosure. In some embodiments, the sensing units 104 and the display units 142 may be disposed on opposite sides of the flexible substrate 102 in the direction Z, so that the flexible substrate 102 may be disposed between the sensing units 104 and the display units 142, but not limited herein. The sensing electrodes 176 in the sensing units 104 may be disposed on the middle substrate 174, that is, the sensing units 104 may be disposed between the middle substrate 174 and the flexible substrate 102, but not limited herein. The flexible electronic device 10 may further include an insulating layer IN7, and the insulating layer IN7 may be disposed on the middle substrate 174 and cover the sensing electrodes 176, but not limited herein. The flexible electronic device 10 may further include an adhesive layer 182 disposed between the flexible substrate 102 and the insulating layer IN7, but not limited herein.

Figure 18:
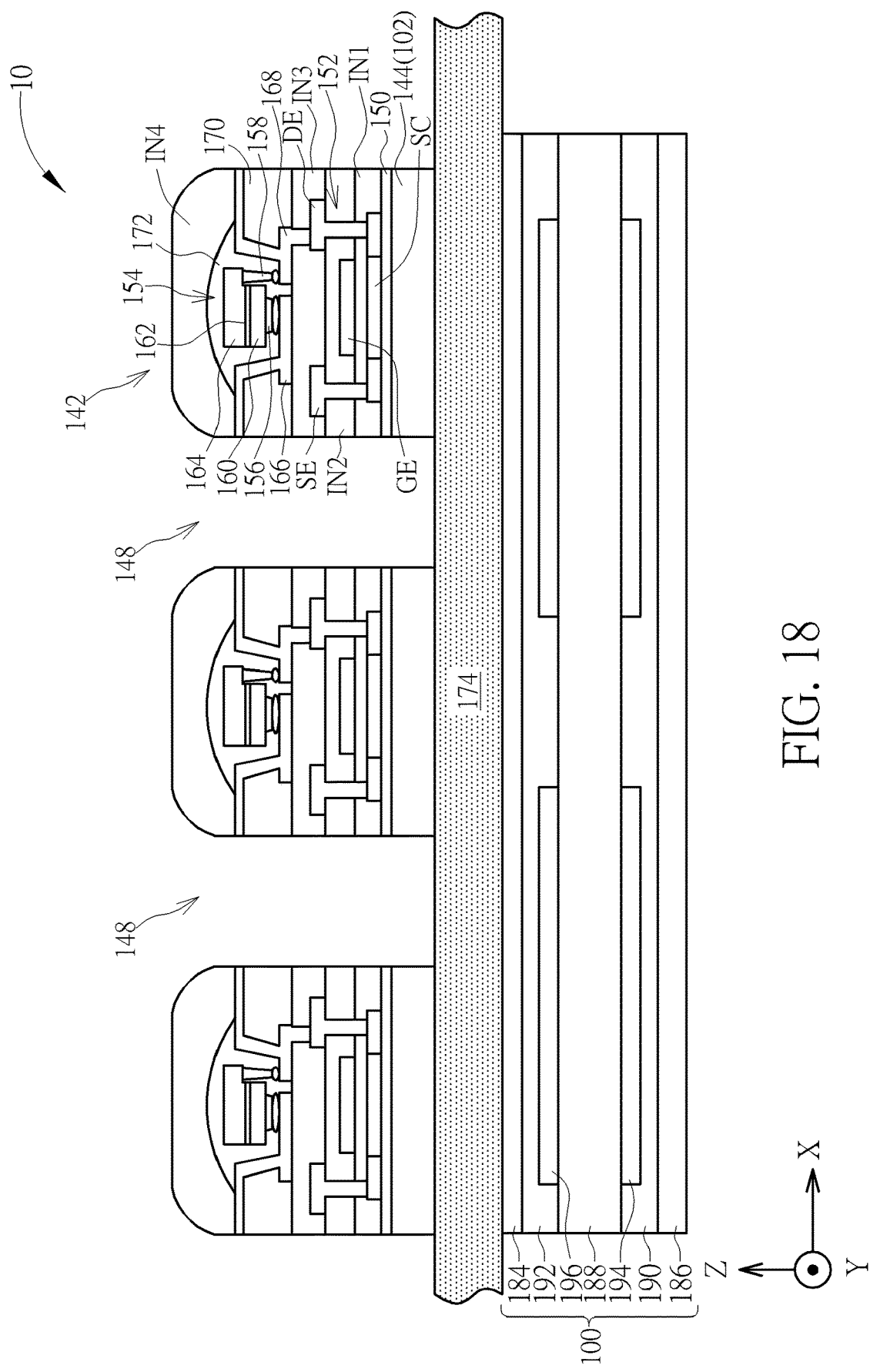
FIG. 18 is a cross-sectional view schematic diagram of a flexible electronic device according to an eleventh embodiment of the present disclosure.

Please refer to FIG. 18, which is a cross-sectional view schematic diagram of a flexible electronic device according to an eleventh embodiment of the present disclosure. In some embodiments, the protruding unit 100 may include a haptic actuator, and the protruding unit 100 may include a substrate 186, a piezoelectric material layer 188, an insulating layer 190, an insulating layer 192, a plurality of electrodes 194 and a plurality of electrodes 196, but not limited herein. The piezoelectric material layer 188, the plurality of electrodes 194 and the plurality of electrodes 196 may be disposed on the substrate 186. The piezoelectric material layer 188 may be disposed between the plurality of electrodes 194 and the plurality of electrodes 196. The insulating layer 190 may be disposed on the substrate 186, the piezoelectric material layer 188 may be disposed on the insulating layer 190, and the electrodes 194 may be disposed between the piezoelectric material layer 188 and the insulating layer 190. The insulating layer 192 may be disposed on the piezoelectric material layer 188, and the electrodes 196 may be disposed between the insulating layer 192 and the piezoelectric material layer 188. The electrode 196 may be overlapped with the electrode 194 in the direction Z, but not limited herein.

In addition, the flexible electronic device 10 may include an adhesive layer 184 disposed between the insulating layer 192 and the middle substrate 174, so that the protruding unit 100 may be attached to the middle substrate 174 through the adhesive layer 184, but not limited herein. The protruding unit 100 may be deformed by deforming the piezoelectric material layer 188 via applying voltage through the electrodes 194 and the electrodes 196.

Figure 19:
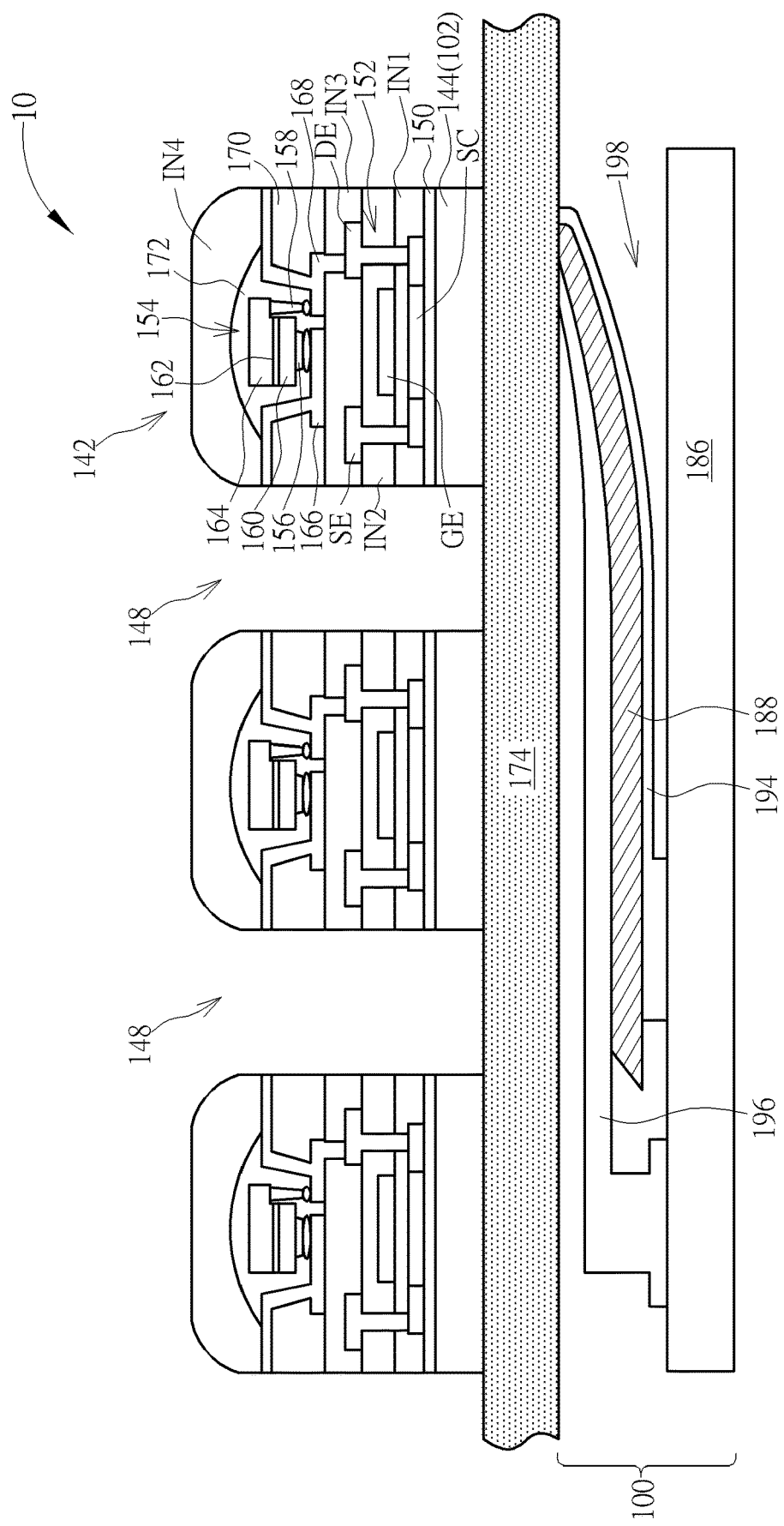
FIG. 19 is a cross-sectional view schematic diagram of a flexible electronic device according to a twelfth embodiment of the present disclosure.

Please refer to FIG. 19, which is a cross-sectional view schematic diagram of a flexible electronic device according to a twelfth embodiment of the present disclosure. In some embodiments, the protruding unit 100 may include a haptic actuator, and the protruding unit 100 may include a substrate 186, a piezoelectric material layer 188, an electrode 194 and an electrode 196, but not limited herein. The electrode 194 and the electrode 196 may be disposed on the substrate 186, and the piezoelectric material layer 188 may be disposed between the electrode 194 and the electrode 196. The protruding unit 100 may be deformed by deforming the piezoelectric material layer 188 via applying voltage through the electrode 194 and the electrode 196, and an air gap 198 may be generated between the substrate 186 and the middle substrate 174, but not limited herein.

Figure 20:
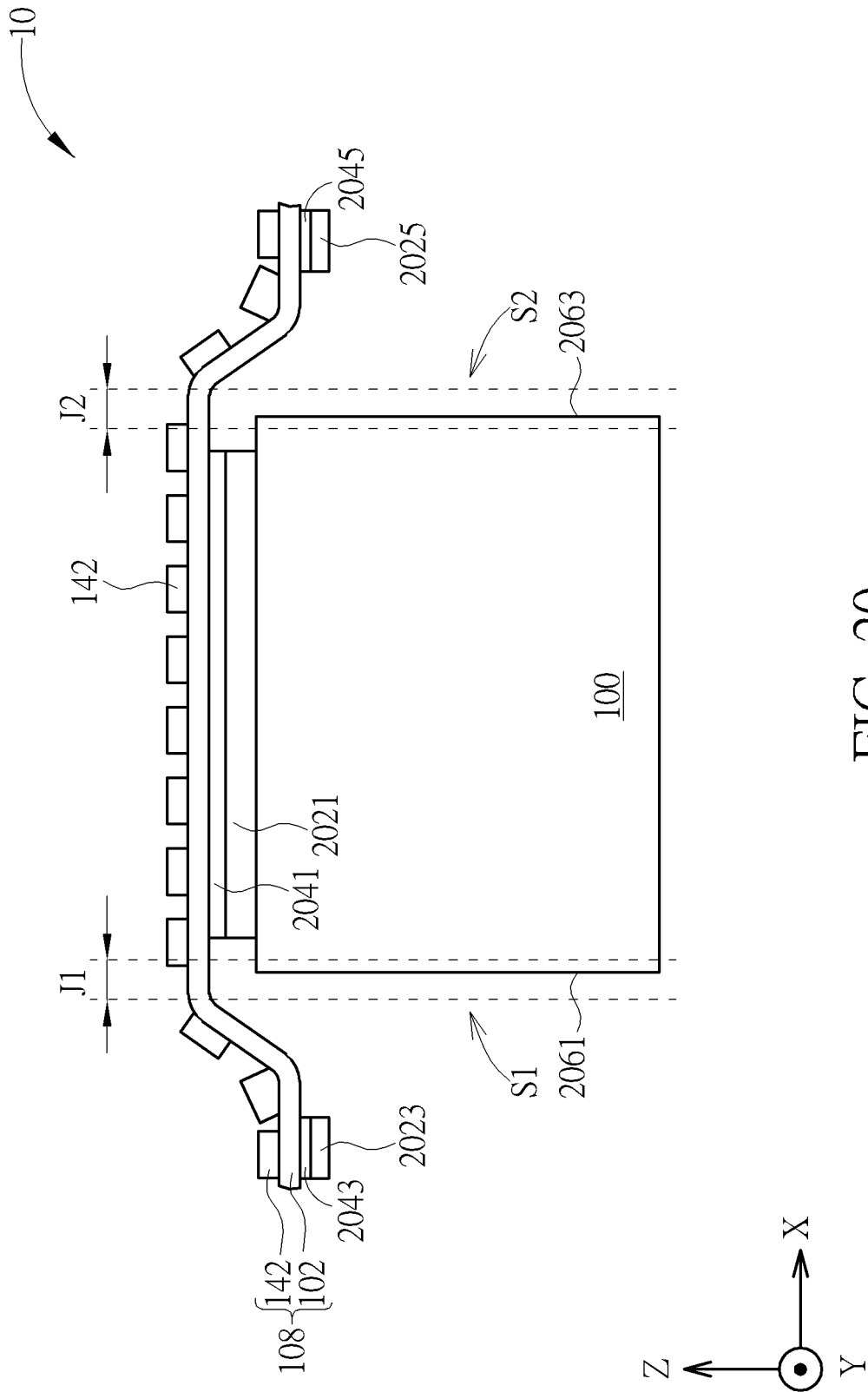
FIG. 20 is a cross-sectional view schematic diagram of a flexible electronic device according to a thirteenth embodiment of the present disclosure.

Please refer to FIG. 20, which is a cross-sectional view schematic diagram of a flexible electronic device according to a thirteenth embodiment of the present disclosure. In some embodiments, the flexible electronic device 10 may include a plurality of vibrators, such as a vibrator 2021, a vibrator 2023 and a vibrator 2025, but not limited herein. For example, the vibrator 2021 may be disposed between the protruding unit 100 and the flexible substrate 102 in the direction Z. The vibrator 2023 may be disposed on one side Si of the protruding unit 100 in the direction X and not overlapped with the protruding unit 100 in the direction Z. The vibrator 2025 may be disposed on another side S2 of the protruding unit 100 in the direction X and not overlapped with the protruding unit 100 in the direction Z, but not limited herein. In some embodiments, the flexible electronic device 10 may include one vibrator, such as a vibrator 2021, but not limited herein. The vibrator may include a vibration motor, but not limited herein.

The flexible electronic device 10 may include a plurality of adhesive layers, such as an adhesive layer 2041, an adhesive layer 2043 and an adhesive layer 2045, but not limited herein. For example, the adhesive layer 2041 may be disposed between the vibrator 2021 and the flexible substrate 102, the adhesive layer 2043 may be disposed between the vibrator 2023 and the flexible substrate 102, and the adhesive layer 2045 may be disposed between the vibrator 2025 and the flexible substrate 102, but not limited herein. In some embodiments, an adhesive layer (not shown) may be disposed between the vibrator 2021 and the protruding unit 100, but not limited herein.

The protruding unit 100 may include a side 2061 and a side 2063 opposite to the side 2061, and the flexible electronic device 10 may include a region J1 and a region J2. The side 2061 may be disposed in the region J1, the side 2063 may be disposed in the region J2, and the vibrator(s) may not be disposed in the region J1 and/or the region J2, so as to prevent the vibrator from being damaged due to the deformation of the protruding unit 100. That is to say, according to some embodiments, no vibrator is disposed at the positions of both of the side 2061 and the side 2063 of the protruding unit 100 in the direction Z.

Figure 21:
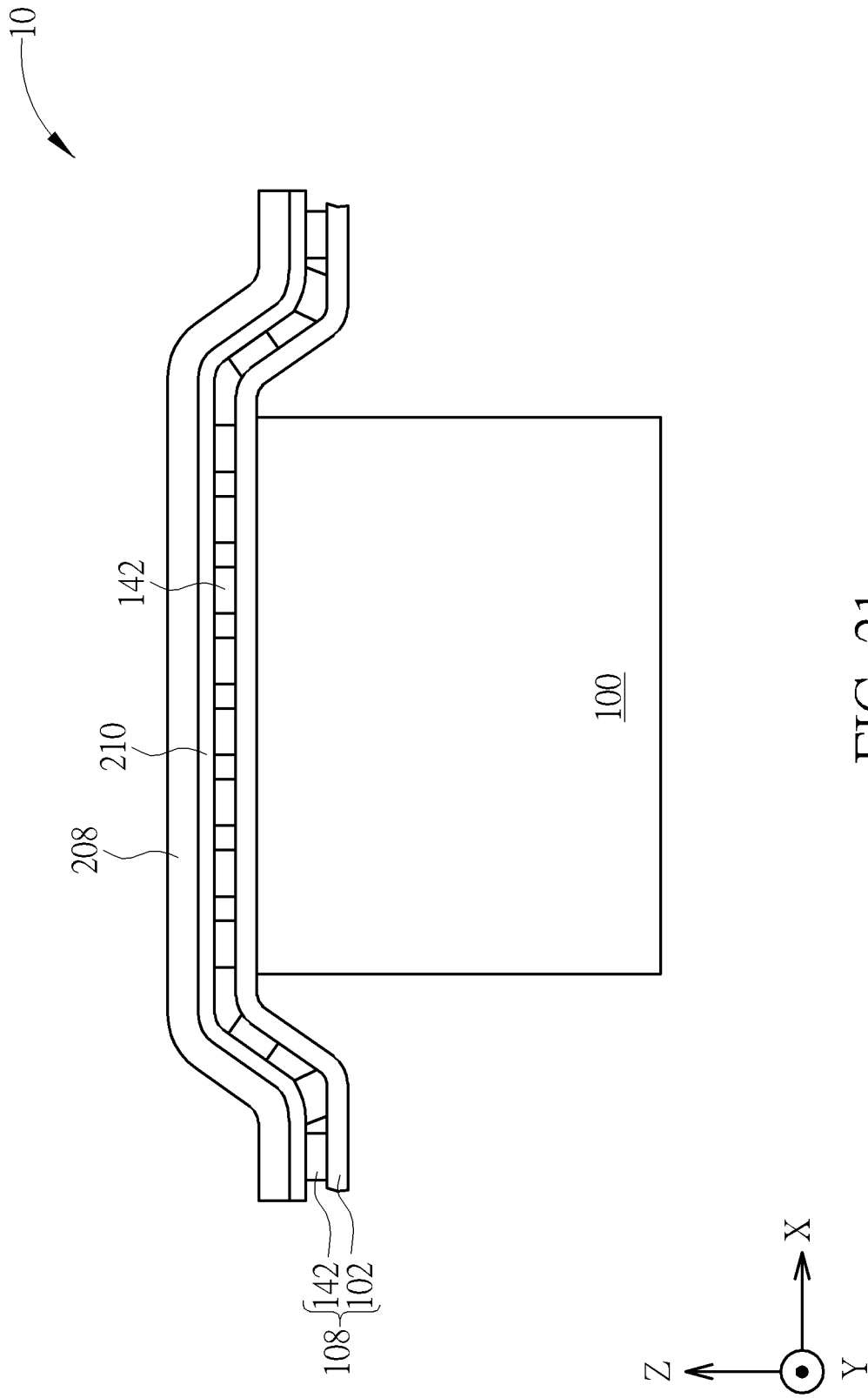
FIG. 21 is a cross-sectional view schematic diagram of a flexible electronic device according to a fourteenth embodiment of the present disclosure.
Figure 22:
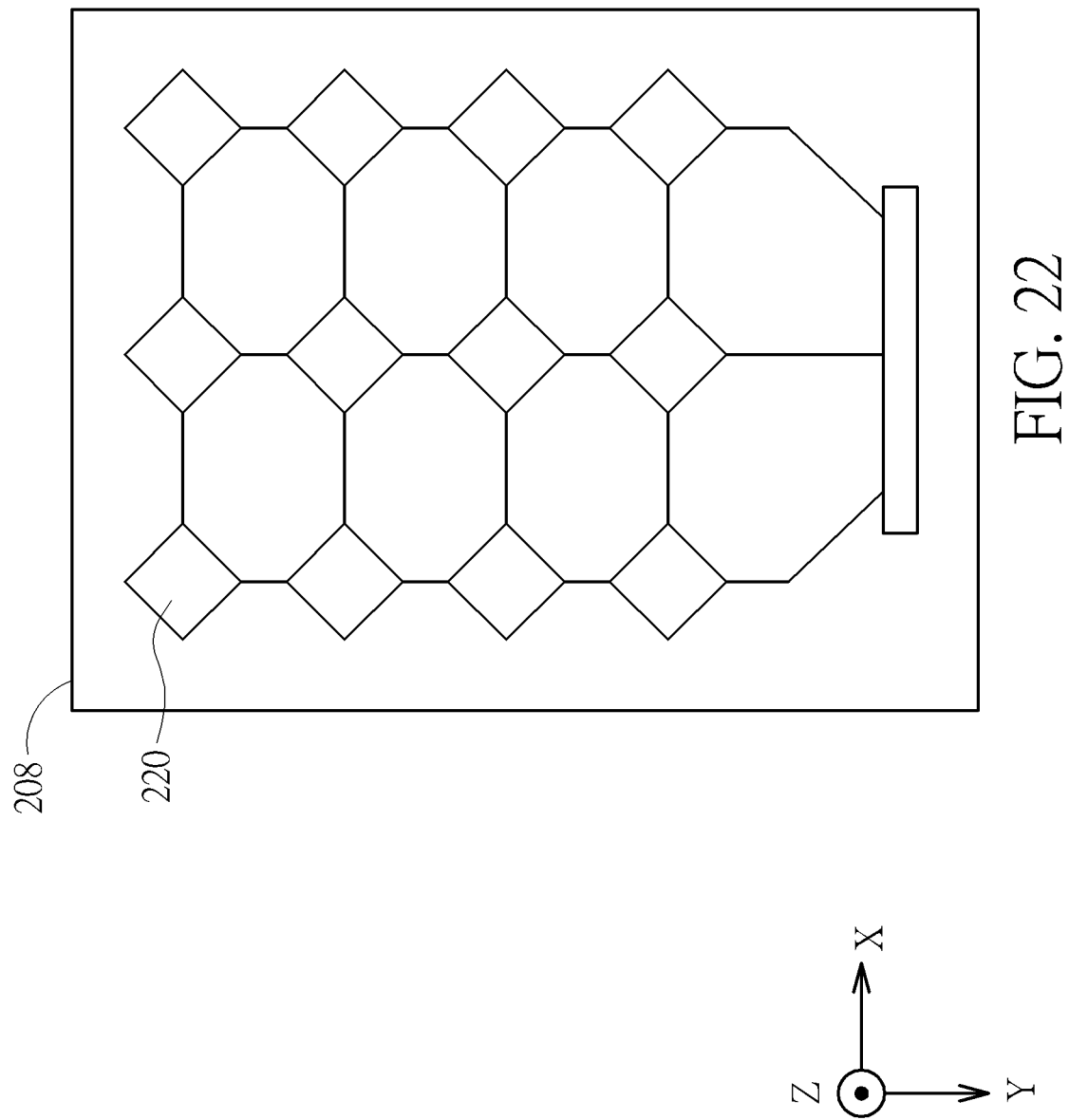
FIG. 22 is a top-view schematic diagram of a vibrator substrate according to the fourteenth embodiment of the present disclosure.

Please refer to FIG. 21 and FIG. 22. FIG. 21 is a cross-sectional view schematic diagram of a flexible electronic device according to a fourteenth embodiment of the present disclosure. FIG. 22 is a top-view schematic diagram of a vibrator substrate according to the fourteenth embodiment of the present disclosure. In some embodiments, the flexible electronic device 10 may include a vibrator substrate 208 and an adhesive layer 210, but not limited herein. For example, the vibration substrate 208 may be disposed on the display units 142, and the adhesive layer 210 may be disposed between the vibration substrate 208 and the display units 142, but not limited herein. The vibration substrate 208 may be disposed on an upper surface of the panel 108. The upper surface of the panel 108 is indicated by the upper surface of the display unit 142 in FIG. 21, but the present disclosure is not limited herein. As shown in FIG. 22, a patterned piezoelectric material layer 220 may be disposed on the vibration substrate 208, and a voltage may be applied to the patterned piezoelectric material layer 220 to generate vibration, but not limited herein.

In some embodiments, although not shown in the drawings, a vibration layer (such as a piezoelectric material layer) may be disposed as an entire plane on the upper surface of the panel 108 (or on the display units 142). That is to say, the vibration layer may have no pattern. The vibration layer may be formed by a coating process, but not limited herein. In some embodiments, although not shown in the drawings, a plurality of vibration layers may be disposed on the upper surface of the panel 108. For example, one of the vibration layers may be disposed on one of the light-emitting elements. In some embodiments, although not shown the drawings, one vibration layer may be disposed on one of the main portions 144, and the vibration layer may be formed by a coating process, but not limited herein. For example, a plurality of vibration layers may be respectively disposed on a plurality of light-emitting elements in the panel 108. For example, three vibration layers may be respectively disposed on the three light-emitting elements 154 in FIG. 18, specifically, disposed on three separate portions of the insulating layer IN4 on the three light-emitting elements 154 in FIG. 18.

In the present disclosure, the electrode may include metal, alloy, transparent conductive materials, other suitable conductive materials or a combination of the above materials, but not limited herein. The insulating layer may include inorganic insulating materials, organic insulating materials, other suitable insulating materials or a combination of the above materials, but not limited herein.

In some embodiments, the flexible electronic device 10 may be applied in a vehicle. For example, the flexible electronic device 10 may be applied to a steering wheel, a gear shift, a center console, a dashboard, other suitable positions or a combination of the above objects in a vehicle, but not limited herein.

From the above description, in the flexible electronic device according the embodiments of the present disclosure, through the design of the appropriate proportion for the area of the deformation region of the flexible substrate and the area of the sensing unit disposed on the flexible substrate, the sensing units may not be easily damaged by the deformation of the flexible substrate when the flexible substrate is deformed by the protruding unit and also provide a good sensing effect, thereby improving the user experience and reliability of the flexible electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A flexible electronic device, comprising:
a protruding unit;
a flexible substrate disposed on the protruding unit and having a deformation region corresponding to the protruding unit;
a plurality of sensing units disposed on the flexible substrate, wherein at least one of the plurality of sensing units is overlapped with the deformation region; and
a plurality of display units disposed on the flexible substrate, wherein at least one of the plurality of display units is overlapped with the deformation region,
wherein a ratio of an area of the deformation region to an area of one of the at least one of the plurality of sensing units is greater than or equal to 1.4 and less than or equal to 2222,
wherein a ratio of the area of the deformation region to an area of one of the at least one of the plurality of display units is greater than or equal to 53.08 and less than or equal to 1000000.

2. The flexible electronic device as claimed in claim 1, wherein the plurality of sensing units comprise capacitance sensors, pressure sensors, electromagnetic sensors, optical sensors or a combination of the capacitance sensors, the pressure sensors, the electromagnetic sensors and the optical sensors.

3. The flexible electronic device as claimed in claim 1, wherein the plurality of sensing units are capable of sensing a touch.

4. The flexible electronic device as claimed in claim 1, wherein the plurality of display units are disposed between the flexible substrate and the plurality of sensing units.

5. The flexible electronic device as claimed in claim 1, wherein the plurality of sensing units are disposed between the flexible substrate and the plurality of display units.

6. The flexible electronic device as claimed in claim 1, wherein the flexible substrate comprises a plurality of main portions, and two adjacent ones of the plurality of main portions are connected to each other.

7. The flexible electronic device as claimed in claim 6, wherein the deformation region comprises at least one of the plurality of main portions.

8. The flexible electronic device as claimed in claim 7, wherein a ratio of the area of the deformation region to an area of one of the at least one of the plurality of main portions is greater than or equal to 26.01 and less than or equal to 500000.

9. The flexible electronic device as claimed in claim 1, wherein the protruding unit comprises an actuator.

10. The flexible electronic device as claimed in claim 9, wherein the actuator is configured to provide haptic feedback.

11. The flexible electronic device as claimed in claim 1, further comprising a middle substrate disposed between the flexible substrate and the protruding unit.

12. The flexible electronic device as claimed in claim 1, wherein the deformation region is capable of being stuck out by the protruding unit.

13. The flexible electronic device as claimed in claim 1, wherein a height of the deformation region is greater than or equal to 0.5 mm and less than or equal to 50 mm.

* * * * *